(12) United States Patent
Inukai

(10) Patent No.: US 7,042,427 B2
(45) Date of Patent: May 9, 2006

(54) LIGHT EMITTING DEVICE

(75) Inventor: Kazutaka Inukai, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 443 days.

(21) Appl. No.: 10/057,657

(22) Filed: Jan. 23, 2002

(65) Prior Publication Data
US 2002/0101395 A1 Aug. 1, 2002

(30) Foreign Application Priority Data
Jan. 29, 2001 (JP) .............................. 2001-020695

(51) Int. Cl.
*G09G 3/30* (2006.01)
(52) U.S. Cl. .................. 345/77; 345/211; 345/212; 345/82; 315/169.3
(58) Field of Classification Search ........ 345/211–212, 345/77–78, 82–83; 315/169.3
See application file for complete search history.

(56) References Cited

U.S. PATENT DOCUMENTS

| | | | |
|---|---|---|---|
| 5,886,474 A | 3/1999 | Asai et al. | |
| 6,239,788 B1 | 5/2001 | Nohno et al. | |
| 6,310,759 B1 | 10/2001 | Ishigaki et al. | |
| 6,414,443 B1 | 7/2002 | Tsuruoka et al. | |
| 6,414,661 B1 * | 7/2002 | Shen et al. | 345/82 |
| 6,424,326 B1 | 7/2002 | Yamazaki et al. | |
| 6,452,341 B1 | 9/2002 | Yamauchi et al. | |
| 6,473,065 B1 | 10/2002 | Fan | |
| 6,501,230 B1 | 12/2002 | Feldman | |
| 6,518,962 B1 * | 2/2003 | Kimura et al. | 345/211 |
| 6,710,548 B1 | 3/2004 | Kimura | |
| 6,788,003 B1 | 9/2004 | Inukai et al. | |

(Continued)

FOREIGN PATENT DOCUMENTS

EP 0 905 673 3/1999

(Continued)

OTHER PUBLICATIONS

Australian Patent Office Written Opinion and Search Report (Application No. SG 200200038-8); 8 pages; Oct. 20, 2003.
Tsutsui et al. "Electroluminescence in Organic Thin Films." Photochemical Process in Organized Molecular Systems, 1991, pp. 437-450.

(Continued)

*Primary Examiner*—Amr A. Awad
(74) *Attorney, Agent, or Firm*—Fish & Richardson P.C.

(57) ABSTRACT

A light emitting device with a simple and easy structure without waste is provided, in which a change of luminance of an OLED is suppressed and a desired color display can be stably performed even if an organic light emitting layer is somewhat deteriorated or an environmental temperature is varied. A driving current of the OLED of a pixel portion is measured, and a value of the voltage supplied to the pixel portion from a variable power supply is corrected such that the measured driving current has a reference value. When the driving current of the OLED is measured, a monitor video signal of a different system from that of a video signal for displaying an image is used to display a monitor image on the pixel portion. With the above-described structure, a reduction of the luminance accompanied with the deterioration of the organic light emitting layer can be suppressed. As a result, a clear image can be displayed.

45 Claims, 18 Drawing Sheets

U.S. PATENT DOCUMENTS

| | | |
|---|---|---|
| 6,828,951 B1 | 12/2004 | Yamazaki et al. |
| 6,844,683 B1 | 1/2005 | Yamauchi et al. |
| 2001/0013758 A1 | 8/2001 | Tsuruoka et al. |
| 2001/0033252 A1 | 10/2001 | Yamazaki et al. |
| 2002/0125831 A1 | 9/2002 | Inukai et al. |
| 2002/0180721 A1 | 12/2002 | Kimura et al. |
| 2004/0263445 A1 | 12/2004 | Inukai et al. |
| 2005/0073241 A1 | 4/2005 | Yamauchi et al. |
| 2005/0073242 A1 | 4/2005 | Yamauchi et al. |

FOREIGN PATENT DOCUMENTS

| | | |
|---|---|---|
| EP | 0 923 067 | 6/1999 |
| EP | 1 063 704 | 12/2000 |
| EP | 1 148 466 | 10/2001 |
| EP | 1 227 467 | 7/2002 |
| GB | 2 106 299 | 4/1983 |
| JP | 2001-223074 | 8/2001 |
| TW | 397965 | 7/2000 |

OTHER PUBLICATIONS

Baldo et al. "Highly Efficient Phosphorescent Emission from Organic Electroluminescent Devices." Nature vol. 395, Sep. 10, 1998, pp. 151-154.

Baldo et al. "Very High-Efficiency Green Organic Light-Emitting Devices Based on Electrophosphorescence." Applied Physics Letters vol. 75(1), Jul. 5, 1999, pp. 4-6.

Tsutsui et al. "High Quantum Efficiency in Organic Light-Emitting Devices with Iridium-Complex as a Triplet Emissive Center." Japanese Journal of Applied Physics vol. 38, Part 12B, Dec. 15, 1999, pp. L1502-L1504.

U.S. Appl. No. 09/833,673.

U.S. Appl. No. 09/753,708.

Kazutaka inukai et al., "4.0 in. TFT-OLED Displays and a Novel Digital Driving Method"; *SID International Symposium Digest of Technical Papers*; pp. 924-927; 2000.

* cited by examiner

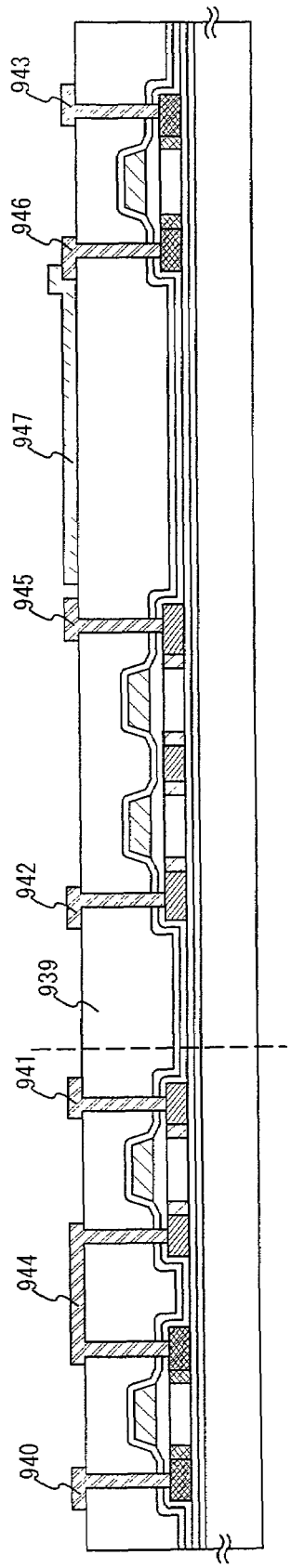
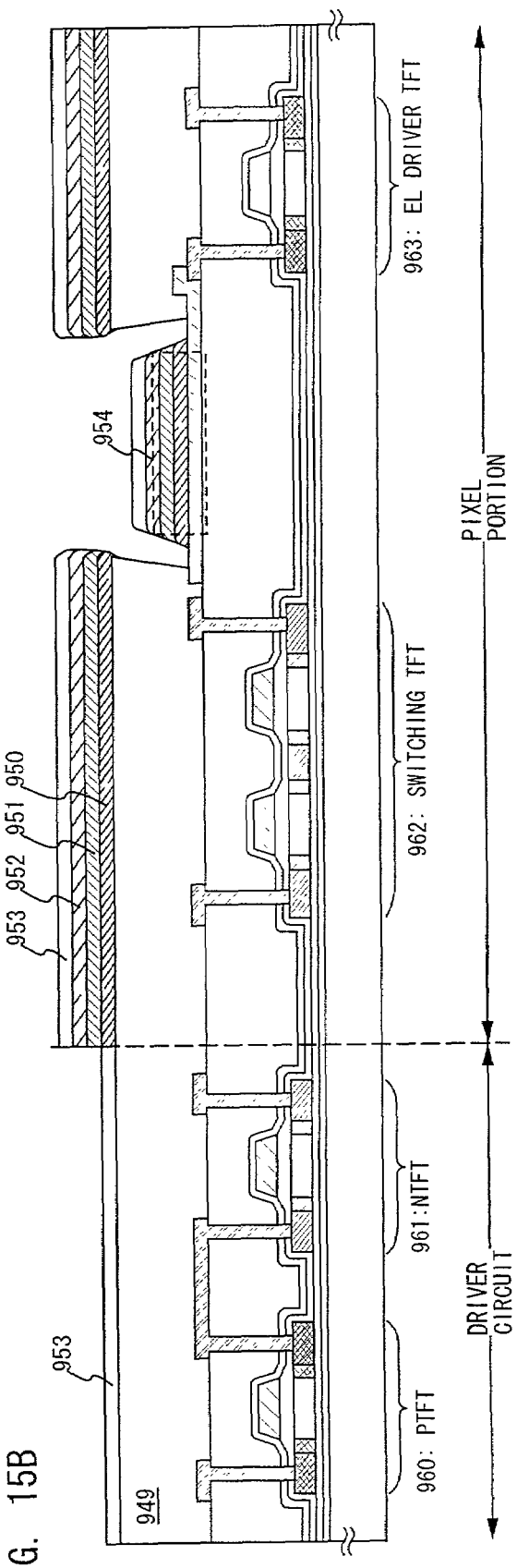
FIG. 15A
FIG. 15B

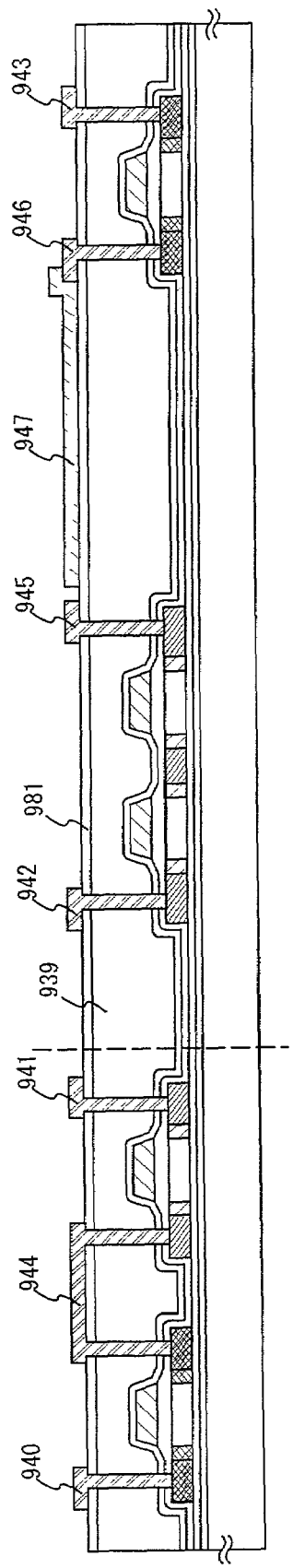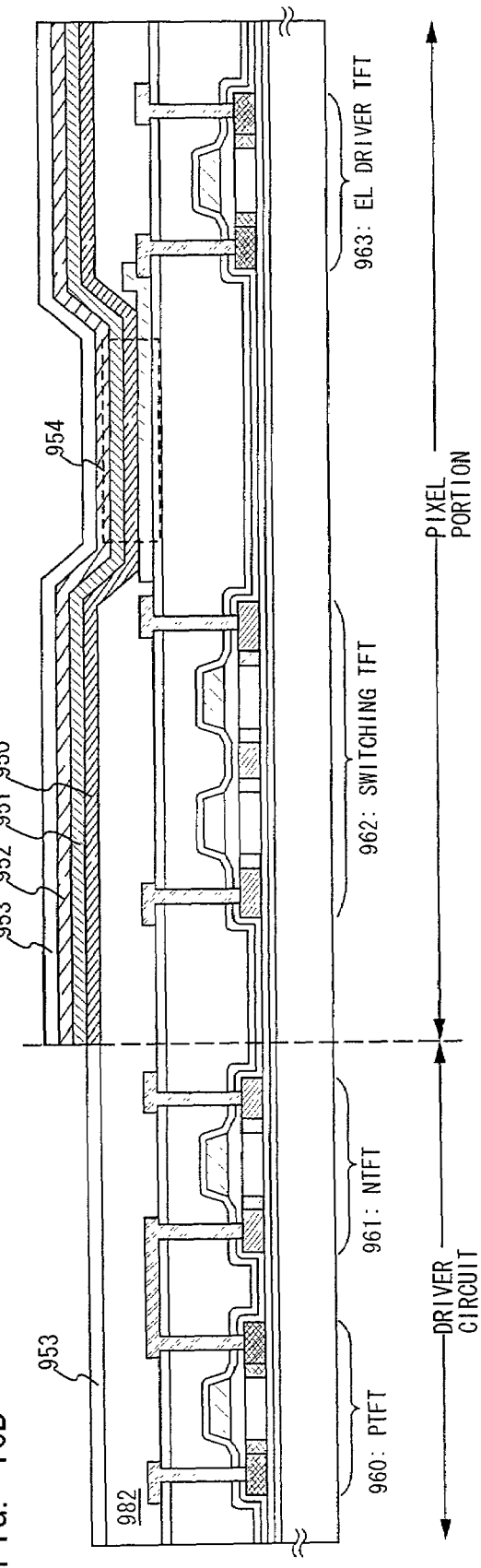
FIG. 16A
FIG. 16B

LIGHT EMITTING DEVICE

BACKGROUND OF THE INVENTION

1. Field of the Invention

The present invention relates to an OLED panel in which an organic light emitting device (OLED) formed on a substrate is enclosed between the substrate and a cover member. Also, the present invention relates to an OLED module in which a controller IC or the like is mounted on the OLED panel. Note that, in this specification, the OLED panel and the OLED module are generically called light emitting devices. The present invention further relates to an electronic device using the light emitting device.

2. Description of the Related Art

An OLED emits light by itself, and thus, has high visibility. The OLED does not need a backlight necessary for a liquid crystal display device (LCD), which is suitable for a reduction of a light emitting device in thickness. Also, the OLED has no limitation on a viewing angle. Therefore, the light emitting device using the OLED has recently been attracting attention as a display device that substitutes for a CRT or the LCD.

The OLED includes a layer containing an organic compound in which luminescence generated by application of an electric field (electroluminescence) is obtained (organic light emitting material) (hereinafter, referred to as organic light emitting layer), an anode layer and a cathode layer. A light emission in returning to a base state from a singlet excitation state (fluorescence) and a light emission in returning to a base state from a triplet excitation state (phosphorescence) exist as the luminescence in the organic compound. The light emitting device of the present invention may use one or both of the above-described light emissions.

Note that, in this specification, all the layers provided between an anode and a cathode of the OLED are defined as the organic light emitting layers. The organic light emitting layers specifically include a light emitting layer, a hole injecting layer, an electron injecting layer, a hole transporting layer, an electron transporting layer and the like. The OLED basically has a structure in which an anode/a light emitting layer/a cathode are laminated in order. Besides this structure, the OLED may take a structure in which an anode/a hole injecting layer/a light emitting layer/a cathode are laminated in order or a structure in which an anode/a hole injecting layer/a light emitting layer/an electron transporting layer/a cathode are laminated in order.

In putting a light emitting device to practical use, a serious problem at present is a reduction in the luminance of the OLED, which is accompanied with deterioration of the organic light emitting material contained in the organic light emitting layer.

The organic light emitting material in the organic light emitting layer is easily affected by moisture, oxygen, light and heat, and the deterioration of the organic light emitting material is promoted by these substances. Specifically, speed of the deterioration of the organic light emitting layer is influenced by a structure of a device for driving the light emitting device, a characteristic of the organic light emitting material constituting the organic light emitting layer, a material for an electrode, conditions in a manufacturing process, a method of driving the light emitting device, and the like.

Even when a constant voltage is applied to the organic light emitting layer from a pair of electrodes, the luminance of the OLED is lowered due to the deterioration of the organic light emitting layer. Then, if the luminance of the OLED is lowered, an image displayed on the light emitting device becomes unclear. Note that, in this specification, a voltage applied to the organic light emitting layer from one pair of electrodes is defined as an OLED driving voltage (Vel).

Further, in a color display mode in which three kinds of OLEDs corresponding to R (red), G (green) and B (blue) are used, the organic light emitting material constituting the organic light emitting layer differs depending on the corresponding color of the OLED. Therefore, there may be the case where the organic light emitting layers of the OLEDs deteriorate at different speeds in accordance with the corresponding colors. In this case, the luminance of the OLED differs depending on the color with the lapse of time. Thus, an image having a desired color can not be displayed on the light emitting device.

Furthermore, the luminance of the OLED has large temperature depending property, and thus, there is a problem in that luminance of a display and a tone vary in accordance with the temperature in constant voltage drive.

SUMMARY OF THE INVENTION

The present invention has been made in view of the above, and an object of the present invention is therefore to provide a light emitting device in which a change of luminance of an OLED is suppressed and a desired color display can be stably performed even when an organic light emitting layer is somewhat deteriorated or when an environmental temperature is varied.

Between a light emission with a constant OLED driving voltage and a light emission with a constant current flowing through the OLED, the present inventor directs an attention to the fact that a reduction of the luminance of the OLED due to deterioration is smaller in the latter. Note that the current flowing through the OLED is called an OLED driving current (Iel) in this specification.

FIG. 2 shows a change of the luminance of the OLED between a case where the OLED driving voltage is constant and a case where the OLED driving current is constant. As shown in FIG. 2, the change of the luminance due to deterioration is smaller in the OLED with the constant OLED driving current. This is because not only an inclination of a straight line L-I becomes small (see FIG. 18B) but also a curve I-V itself moves to the lower side when the OLED is deteriorated (see FIG. 18A).

Thus, the present inventor devised a light emitting device in which an OLED driving voltage can be corrected such that an OLED driving current is always kept constant even if the OLED driving current is varied due to deterioration or the like.

Specifically, the light emitting device of the present invention includes a first means for measuring the OLED driving current of the OLED of a pixel portion, a second means for calculating a voltage applied to the OLED based on the measured value, and a third means for actually controlling the voltage value.

Note that the second means may be a means for comparing the current measured value and a reference value, and the third means may be a means for controlling a variable power supply to shorten a difference between the measured value and the reference value and correcting the OLED driving voltages of an OLED of a display pixel (hereinafter referred to as display OLED or first OLED) and a monitor OLED in the case where the difference exists.

Note that the variable power supply indicates a power supply in which a voltage supplied to a circuit or an element is not constant but variable in this specification.

Then, when the OLED driving current of the OLED of the pixel portion is measured, an image for monitor is displayed on the pixel portion in accordance with a video signal for monitor (hereinafter referred to as monitor video signal). However the monitor video signal is the same as a video signal in the point that the video signals each include gradation information, and only the system of an image to be displayed differs between the signals. The monitor image may be either a static image or a dynamic image. Further, the same gradation may be displayed in all the pixels.

Note that the reference value of the current does not need to be fixed at the same value at all times. A plurality of monitor images with different reference current values are prepared, and the monitor image may be selected every monitor. Of course, several kinds of monitor images with the same reference current value may be prepared.

With the above-described structure, in the light emitting device of the present invention, the reduction of the luminance of the OLED can be suppressed even with the deterioration of the organic light emitting layer. As a result, a clear image can be displayed.

Further, in the color display mode in which three kinds of OLEDs corresponding to R (red), G (green) and B (blue) are used, monitor pixel portions corresponding to the respective colors may be provided, and the OLED driving current may be measured for every OLED of each color to thereby correct the OLED driving voltage. With this structure, the balance of luminance among the respective colors is prevented from being lost, and a desired color can be displayed even when the organic light emitting layers of the OLEDs deteriorate at different speeds in accordance with the corresponding colors.

Further, a temperature of the organic light emitting layer is influenced by an outer temperature, heat generated by the OLED panel itself, or the like. Generally, when the OLED is driven at a constant voltage, the value of the flowing current changes in accordance with the temperature. FIG. 3 shows a change of a voltage-current characteristic of the OLED when the temperature of the organic light emitting layer is changed. When the voltage is constant, if the temperature of the organic light emitting layer becomes higher, the OLED driving current becomes larger. Since the relationship between the OLED driving current and the luminance of the OLED is substantially proportional, the luminance of the OLED becomes higher as the OLED driving current becomes larger. In FIG. 2, the constant voltage luminance shows a vertical period for about 24 hours. This is because a temperature difference between day and night is reflected. However, in the light emitting device of the present invention, the OLED driving current can always be kept constant by the correction of the OLED driving voltage even if the temperature of the organic light emitting layer is changed. Therefore, a constant luminance can be obtained without being influenced by the temperature change, and also, the increase in power consumption accompanied with the temperature rise can be prevented.

Moreover, a degree of the change of the OLED driving current in the temperature change generally differs depending on the kind of the organic light emitting material. Thus, in the color display, the luminances of the OLEDs of the respective colors may be separately changed in accordance with the temperature. However, in the light emitting device of the present invention, the constant luminance can be obtained without being influenced by the temperature change. Thus, the balance of luminance among the respective colors is prevented from being lost, and a desired color can be displayed.

Incidentally, the present invention is particularly effective for an active matrix light emitting device of digital time gradation drive, and is also effective for an active matrix light emitting device of analogue gradation drive. Further, the present invention can be applied to a passive light emitting device.

BRIEF DESCRIPTION OF THE DRAWINGS

In the accompanying drawings:

FIGS. 15A and 15B show the method of manufacturing the light emitting device of the present invention;

FIGS. 16A and 16B show a method of manufacturing the light emitting device of the present invention;

DETAILED DESCRIPTION OF THE PREFERRED EMBODIMENTS

Hereinafter, the structure of the present invention will be described.

Figure 1:
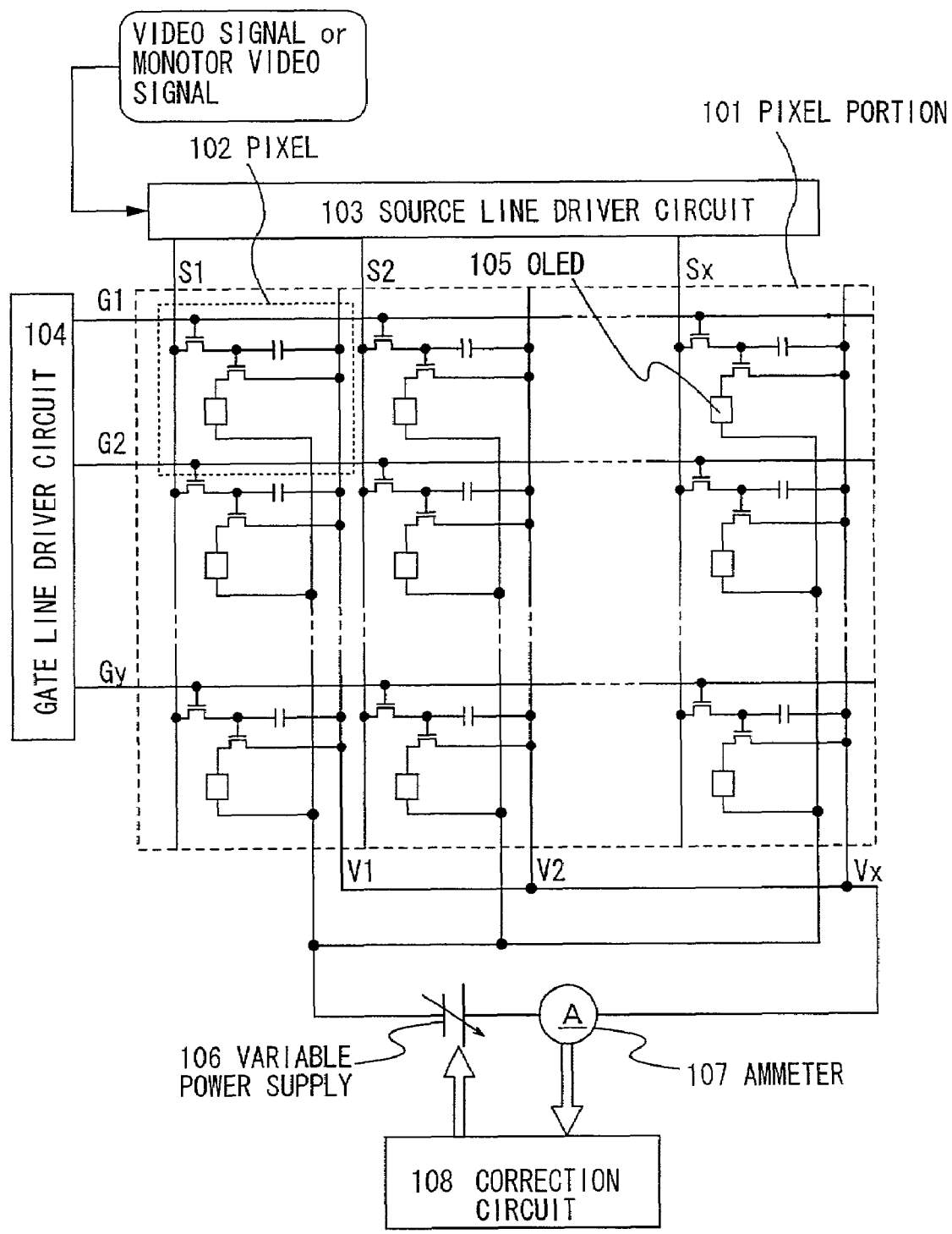
FIG. 1 is a block diagram of a light emitting device of the present invention.

FIG. 1 is a block diagram of the structure of an OLED panel of the present invention. Reference numeral 101 denotes a pixel portion in which a plurality of pixels 102 are formed in matrix. Reference numeral 103 denotes a source line driver circuit and reference numeral 104 denotes a gate line driver circuit.

Note that, although the source line driver circuit 103 and the gate line driver circuit 104 are formed on the substrate on which the pixel portion 101 is formed in FIG. 1, the present invention is not limited to this structure. The source line driver circuit 103 and the gate line driver circuit 104 may be formed on the substrate different from the substrate on which the pixel portion 101 is formed, and may be connected to the pixel portion 101 through a connector such as an FPC. Further, one source line driver circuit 103 and one gate line driver circuit 104 are provided in FIG. 1, but the present invention is not limited to this structure. The number of source line driver circuits 103 and the number of gate line driver circuits 104 may be arbitrarily set by a designer.

Further, in FIG. 1, source lines S1 to Sx, power supply lines V1 to Vx and gate lines G1 to Gy are provided in the pixel portion 101. Note that the number of source lines and the number of power supply lines are not always the same. Further, in addition to these lines, different lines may be provided.

OLEDs 105 are provided in the pixels 102, respectively. Each of the OLEDs 105 has an anode and a cathode. In this specification, in the case where the anode is used as a pixel electrode (first electrode), the cathode is called an opposing electrode (second electrode) while, in the case where the cathode is used as a pixel electrode, the anode is called an opposing electrode.

The pixel electrode of each of the OLEDs 105 of the respective pixels 102 is connected to one of the power supply lines V1 to Vx through one TFT or a plurality of TFTs. The power supply lines V1 to Vx are all connected to a variable power supply 106 through an ammeter 107. Further, the opposing electrodes of the OLEDs 105 are all connected to the variable power supply 106. Note that the opposing electrodes of the OLEDs 105 may be connected to the variable power supply 106 through one element or a plurality of elements.

Note that the variable power supply indicates a power supply in which a voltage supplied to a circuit or an element is variable in this specification. In FIG. 1, the variable power supply 106 is connected such that the power supply line side is kept at a high potential (Vdd) while the opposing electrode side is kept at a low potential (Vss). However, the present invention is not limited to this structure, and the variable power supply 106 may be connected such that the current flown through the OLED 105 has a forward bias.

Incidentally, all the power supply lines V1 to Vx are connected to the ammeter 107 in series in FIG. 1. However, some of the power supply lines V1 to Vx may be connected to the variable power supply 106 through the ammeter 107 and the rest of the power supply lines V1 to Vx may be connected to the variable power supply 106 not through the ammeter 107.

Further, a position where the ammeter 107 is provided is not necessarily located between the variable power supply 106 and the power supply lines. The position may be located between the variable power supply 106 and the opposing electrodes.

Reference numeral 108 denotes a correction circuit which controls the voltage supplied to the opposing electrodes and the power supply lines V1 to Vx from the variable power supply 106 based on a current value (measured value) measured with the ammeter 107.

Incidentally, the ammeter 107, the variable power supply 106, and the correction circuit 108 may be formed on the substrate different from the substrate on which the pixel portion 101 is formed, and may be connected to the pixel portion 101 through a connector or the like. If possible, the above-described components may be formed on the same substrate as the pixel portion 101.

Further, in a color display mode, a variable power supply and an ammeter may be provided for each color, and an OLED driving voltage may be corrected in the OLED of each color. Note that, at this time, the correction circuit may be provided for each color, or the common correction circuit may be provided for the OLEDs of plural colors.

Figure 4:
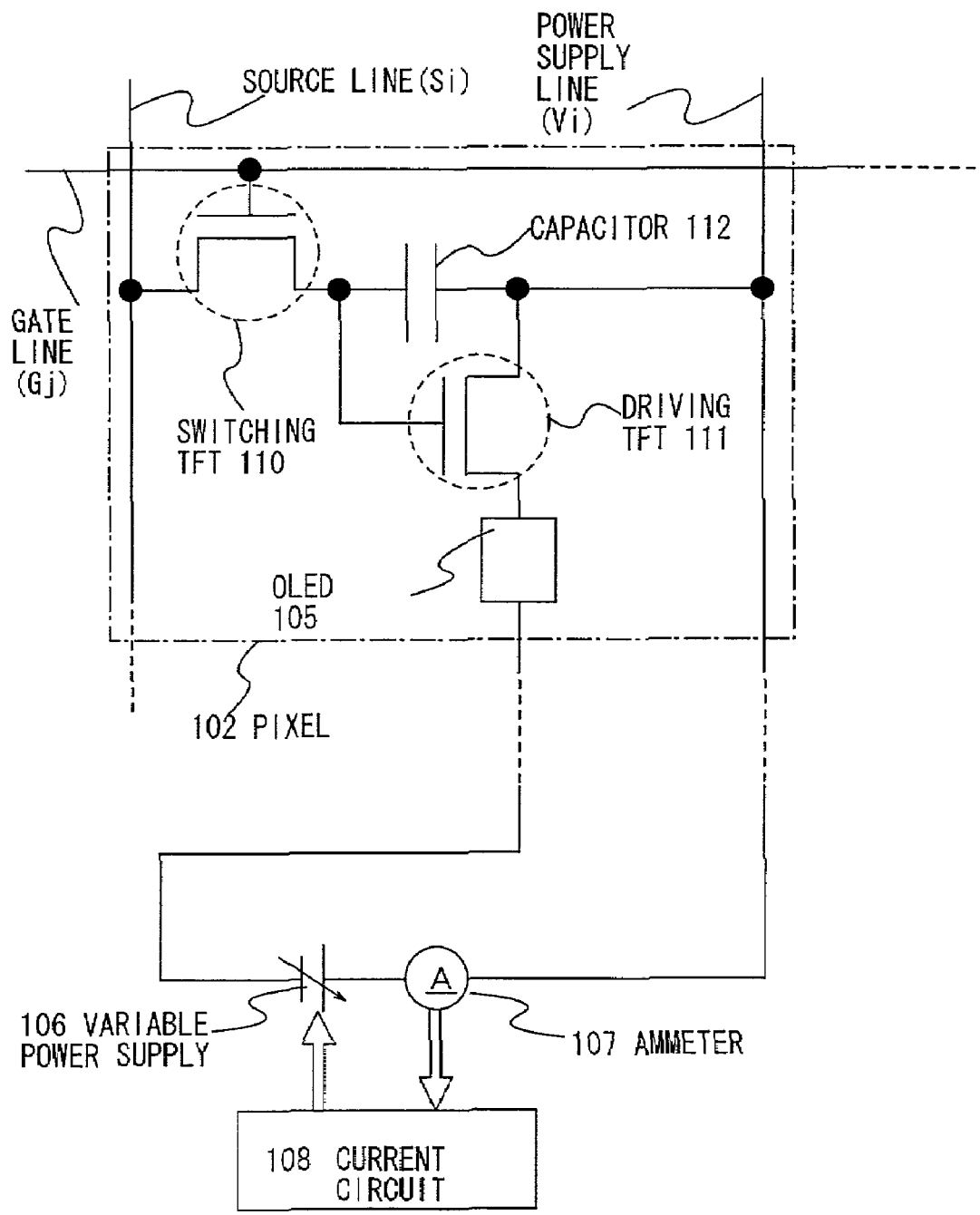
FIG. 4 is a pixel circuit diagram of the light emitting device of the present invention.

FIG. 4 shows the detailed structure of the pixel. The pixel in FIG. 4 has the source line Si (i=1 to x), the gate line Gj (j=1 to y), the power supply line Vi, a switching TFT 110, a driving TFT 111, a capacitor 112 and the OLED 105. The pixel structure shown in FIG. 4 is just one example, and the number of lines and elements of the pixel, the kind thereof and the connection are not limited to those in the structure shown in FIG. 4. The light emitting device of the present invention may take any structure provided that the OLED driving voltage of the OLED of each pixel can be controlled by the variable power supply 106.

In FIG. 4, a gate electrode of the switching TFT 110 is connected to the gate line Gj. One of a source region and a drain region of the switching TFT 110 is connected to the source line Si, and the other is connected to a gate electrode of the driving TFT 111. Then, one of a source region and a drain region of the driving TFT 111 is connected to the power supply line Vi, and the other is connected to the pixel electrode of the OLED 105. The capacitor 112 is formed between the gate electrode of the driving TFT 111 and the power supply line Vi.

In the pixel shown in FIG. 4, the potential of the gate line Gj is controlled by the gate line driver circuit 104, and the source line Si is input with video signal or a monitor video signal by the source line driver circuit 103. When the switching TFT 110 is turned on, the video signal or the monitor video signal input to the source line Si is input to the gate electrode of the driving TFT 111 through the switching TFT 110. Then, when the driving TFT 111 is turned on in accordance with the video signal or the monitor video signal, the OLED driving voltage is applied between the pixel electrode and the opposing electrode of the OLED 105 by the variable power supply 106. Thus, the OLED 105 emits light.

While the OLED 105 is emitting light, a current is measured with the ammeter 107. The measured value as data is sent to the correction circuit 108. The period for the measurement of the current differs depending on a performance of the ammeter 107, and the period needs to have the length equal to or longer than that of the period during which the measurement can be performed. Further, with the ammeter 107, the average value or the maximum value of the current flowing in the measurement period is made to be read.

In the correction circuit 108, the measured value of the current and a predetermined current value (reference value) are compared. Then, in the case where there is some difference between the measured value and the reference value, the correction circuit 108 controls the variable power supply 106, and corrects the voltage between the power supply lines V1 to Vx and the opposing electrodes. Thus, the OLED driving voltage in the OLED of each of the pixels 102 is corrected, and an OLED driving current with a desired size flows.

Note that the OLED driving voltage may be corrected by controlling the potential at the power supply line side or may be corrected by controlling the potential at the opposing electrode side. Further, the OLED driving voltage may be corrected by controlling both the potential at the power supply line side and the potential at the opposing electrode side.

Figure 5:
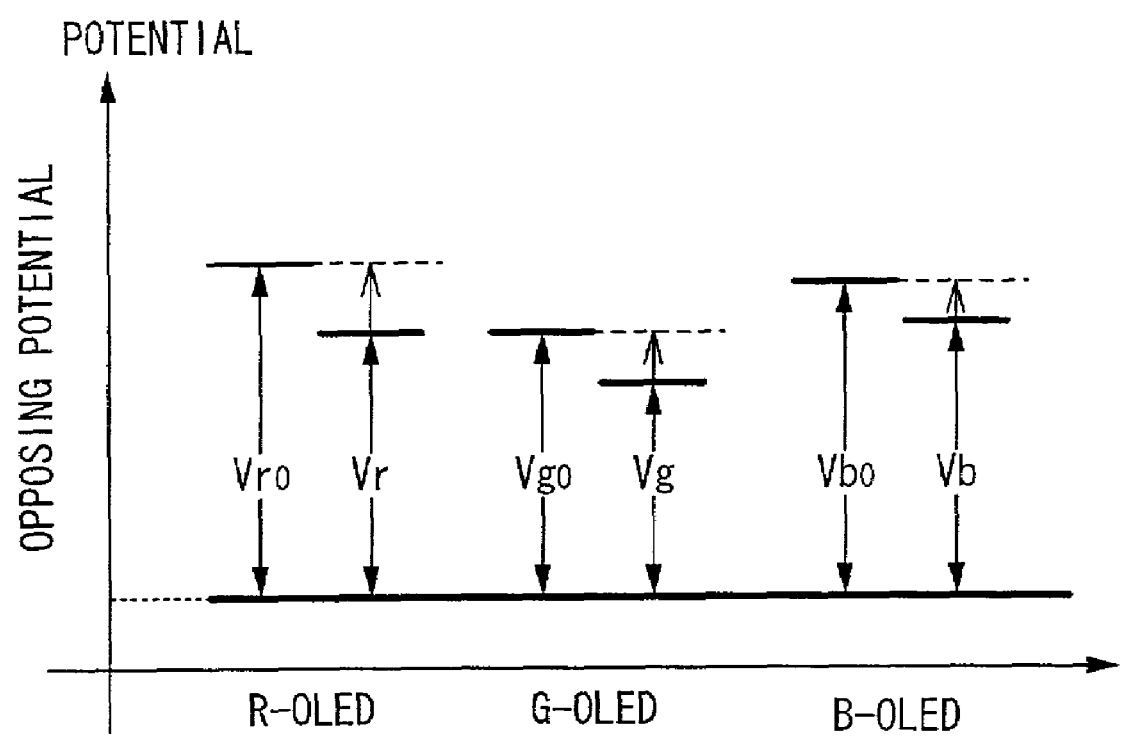
FIG. 5 shows a change of a voltage in accordance with correction.

FIG. 5 shows a change of the OLED driving voltage of the OLED of each color in the case where the potential at the power supply line side is controlled in a color light emitting device. In FIG. 5, Vr indicates the OLED driving voltage before correction in an OLED for R, and $Vr_o$ indicates the OLED driving voltage after correction. Similarly, Vg indicates the OLED driving voltage before correction in an OLED for G, and $Vg_o$ indicates the OLED driving voltage after correction. Vb indicates the OLED driving voltage before correction in an OLED for B, and $Vb_o$ indicates the OLED driving voltage after correction.

In case of FIG. 5, the potentials of the opposing electrodes (opposing potentials) are fixed at the same level in all of the OLEDs. The OLED driving current is measured for every OLED of each color, and the potential of the power supply line (power supply potential) is controlled by the variable power supply, whereby the OLED driving voltage is corrected.

Figure 2:
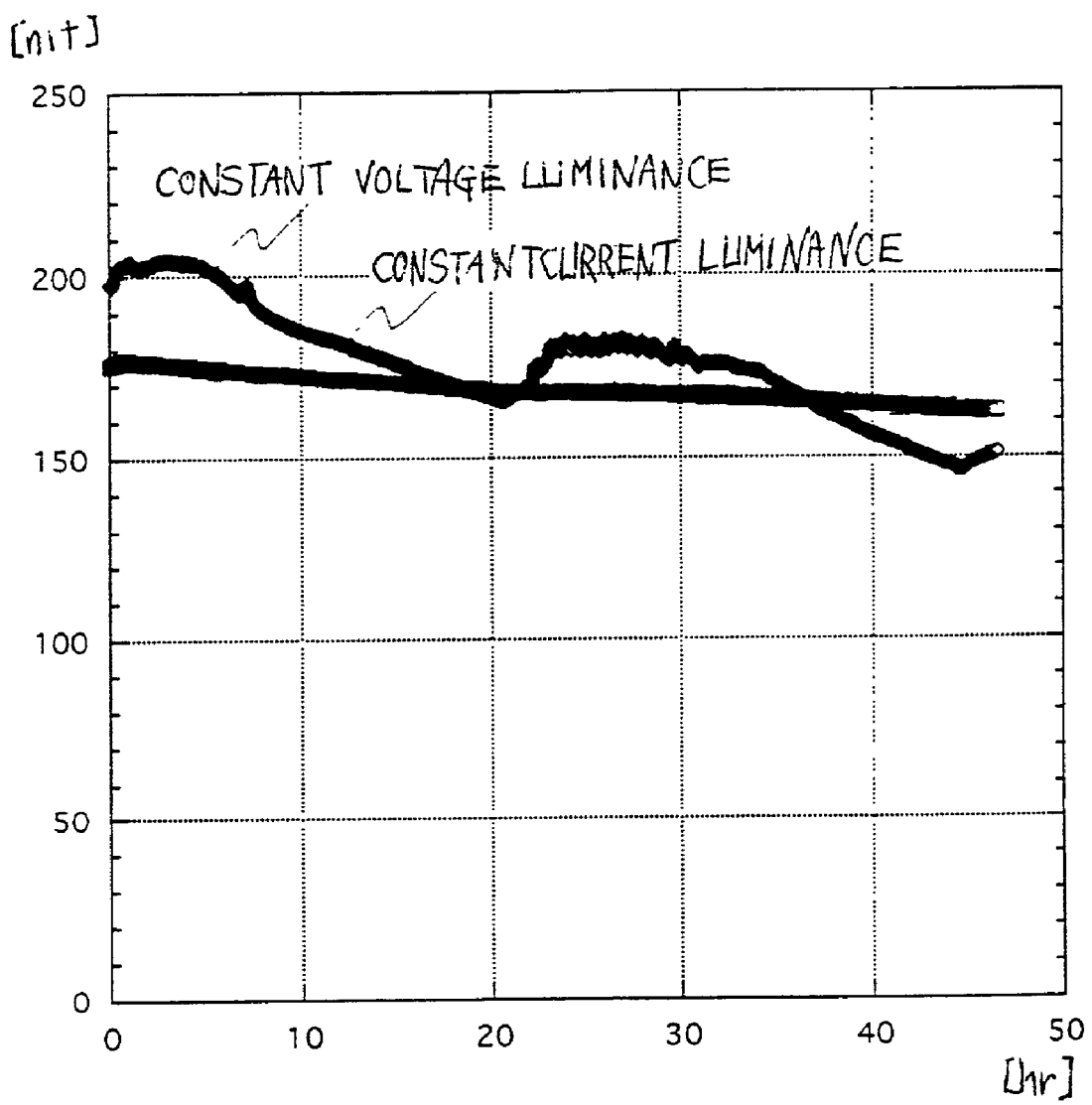
FIG. 2 shows a change of luminance due to deterioration in constant current drive or in constant voltage drive.
Figure 3:
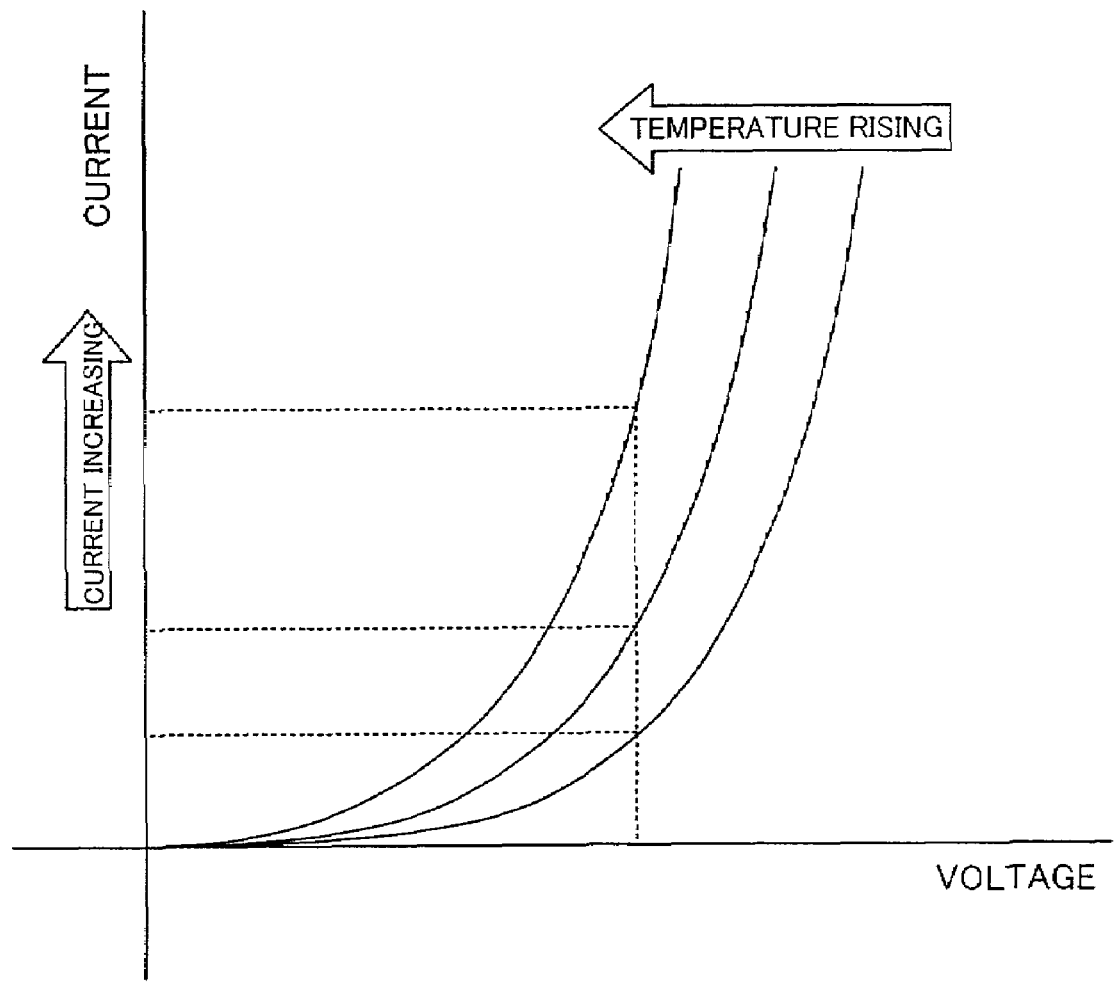
FIG. 3 shows a change of a current in accordance with a temperature of an organic light emitting layer.

In the light emitting device of the present invention, with the above-described structure, there can be obtained the same change of luminance as that obtained when the OLED driving current in FIG. 2 is made constant.

According to the present invention, with the above-described structure, the reduction of the luminance of the OLED can be suppressed even if the organic light emitting layer is deteriorated. As a result, a clear image can be displayed. Further, in case of the light emitting device with the color display in which the OLEDs corresponding to respective colors are used, the balance of luminance among the respective colors is prevented from being lost, and a desired color can be displayed even when the organic light emitting layers of the OLEDs deteriorate at different speeds in accordance with the corresponding colors.

Further, the change of the luminance of the OLED can be suppressed even if the temperature of the organic light emitting layer is influenced by the outer temperature, the heat generated by the OLED panel itself, or the like. Also, the increase in power consumption accompanied with the temperature rise can be prevented. Further, in case of the light emitting device with the color display, the change of the luminance of the OLED of each color can be suppressed without being influenced by the temperature change. Thus, the balance of the luminance among the respective colors is prevented from being lost, and a desired color can be displayed.

[Embodiments]

Hereinafter, embodiments of the present invention will be described.

[Embodiment 1]

In this embodiment, the detailed structure of a correction circuit of a light emitting device of the present invention is described.

Figure 6:
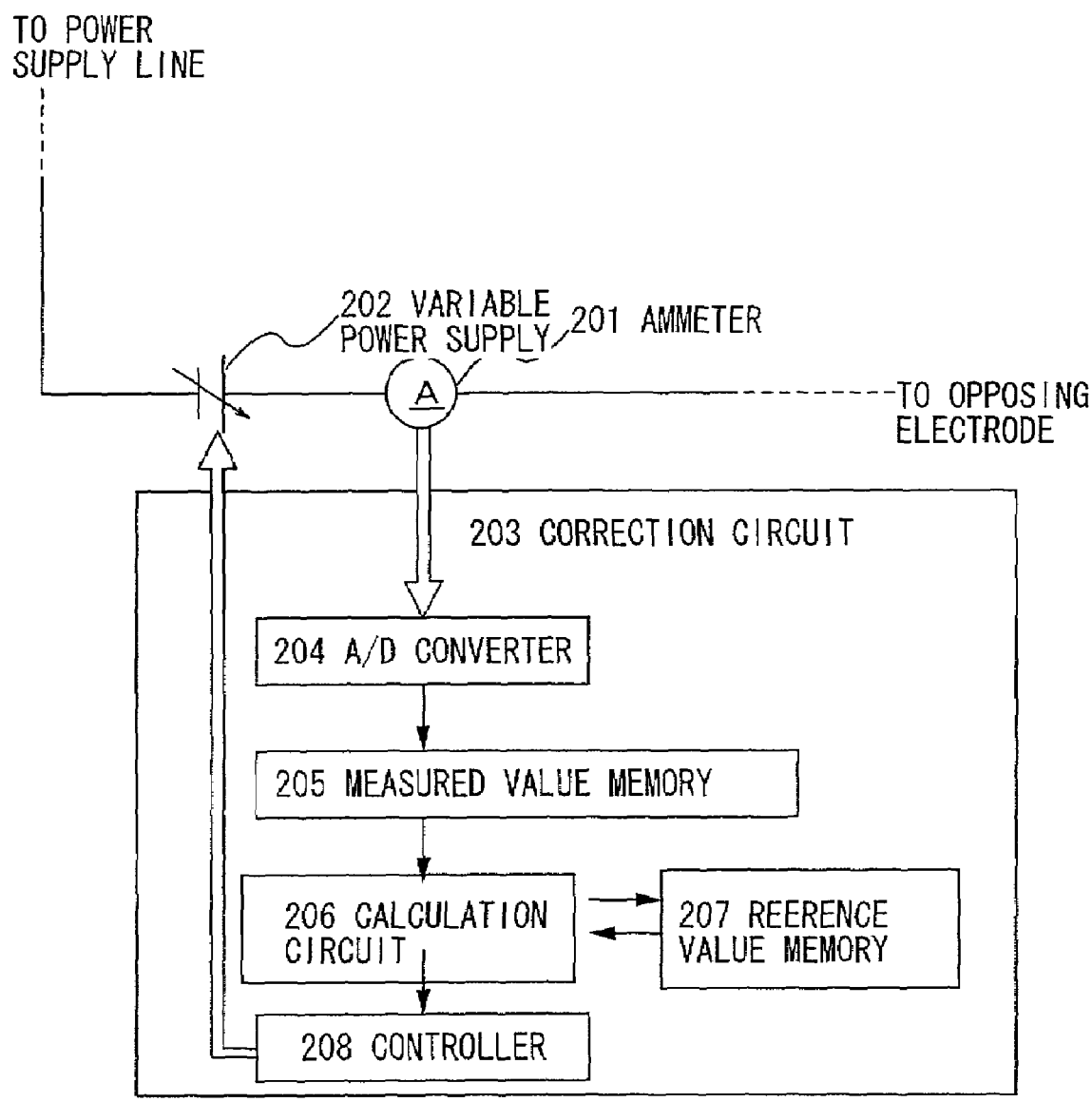
FIG. 6 is a block diagram of a correction circuit.

FIG. 6 is a block diagram of the structure of the correction circuit in this embodiment. A correction circuit 203 includes an A/D converter circuit 204, a memory for measured value 205, a calculation circuit 206, a memory for reference value 207 and a controller 208.

A current value (measured value) measured with an ammeter 201 is input to the A/D converter circuit 204 of the correction circuit 203. In the A/D converter circuit 204, an analogue measured value is converted into a digital one. Digital data of the converted measured value is input to the memory for measured value 205 to be held.

On the other hand, digital data of an ideal measured value what is called a reference value is held in the memory for reference value 207. In the calculation circuit 206, the digital data of the measured value held in the memory for measured value 205 and the digital data of the reference value held in the memory for reference value 207 are read out to be compared.

Then, in accordance with the comparison between the digital data of the measured value and the digital data of the reference value, a variable power supply 202 is controlled in order to make the value of the current actually flowing through the ammeter 201 close to the reference value, whereby the voltage between the power supply lines V1 to Vx and the opposing electrodes is corrected. As a result, the OLED driving voltage in the OLED of each pixel is corrected, and thus, the OLED driving current with a desired size flows.

Figure 7:
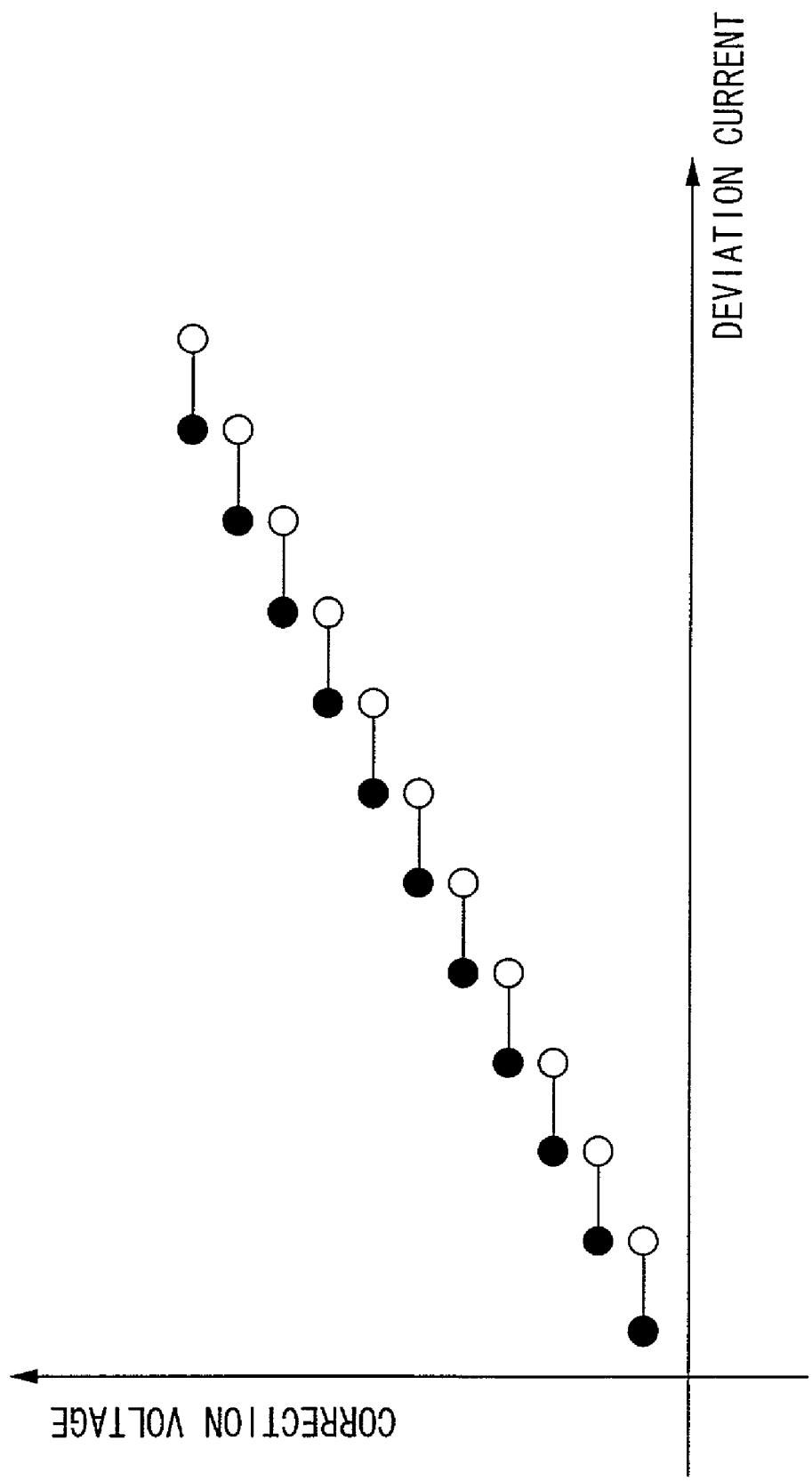
FIG. 7 shows a relationship between a deviation current and a correction voltage.

When it is assumed that the current difference between the measured value and the reference value is a deviation current and that the voltage of the amount for change in accordance with the correction between the power supply lines V1 to Vx and the opposing electrodes is a correction voltage, the relationship between the deviation current and the correction voltage is illustrated in FIG. 7, for example. In FIG. 7, the correction voltage is changed with a constant size every time when the deviation current is changed with a constant width.

Note that the relationship between the deviation current and the correction voltage may not necessarily conform to the graph shown in FIG. 7. It is only necessary that the deviation current and the correction voltage have a relationship such that the value of the current actually flowing through the ammeter becomes close to the reference value. For example, the relationship between the deviation current and the correction voltage may have linearity. Also, the deviation current may be proportional to the second power of the correction voltage.

Note that the structure of the correction circuit shown in this embodiment is just one example, and the present invention is not limited to this structure. It is only necessary that the correction circuit used in the present invention has the means for comparing the measured value and the reference value and the means for performing some calculation processing based on the measured value by means of the ammeter and correcting the OLED driving voltage. It may be only necessary that a calculation processing method for the time when the deviation current becomes a value equal to or larger than a certain fixed value is prescribed instead of performing correction using the current reference value stored in the memory.

[Embodiment 2]

In this embodiment, the structure of a pixel different from that in FIG. 4 in the light emitting device of the present invention is described.

Figure 8:
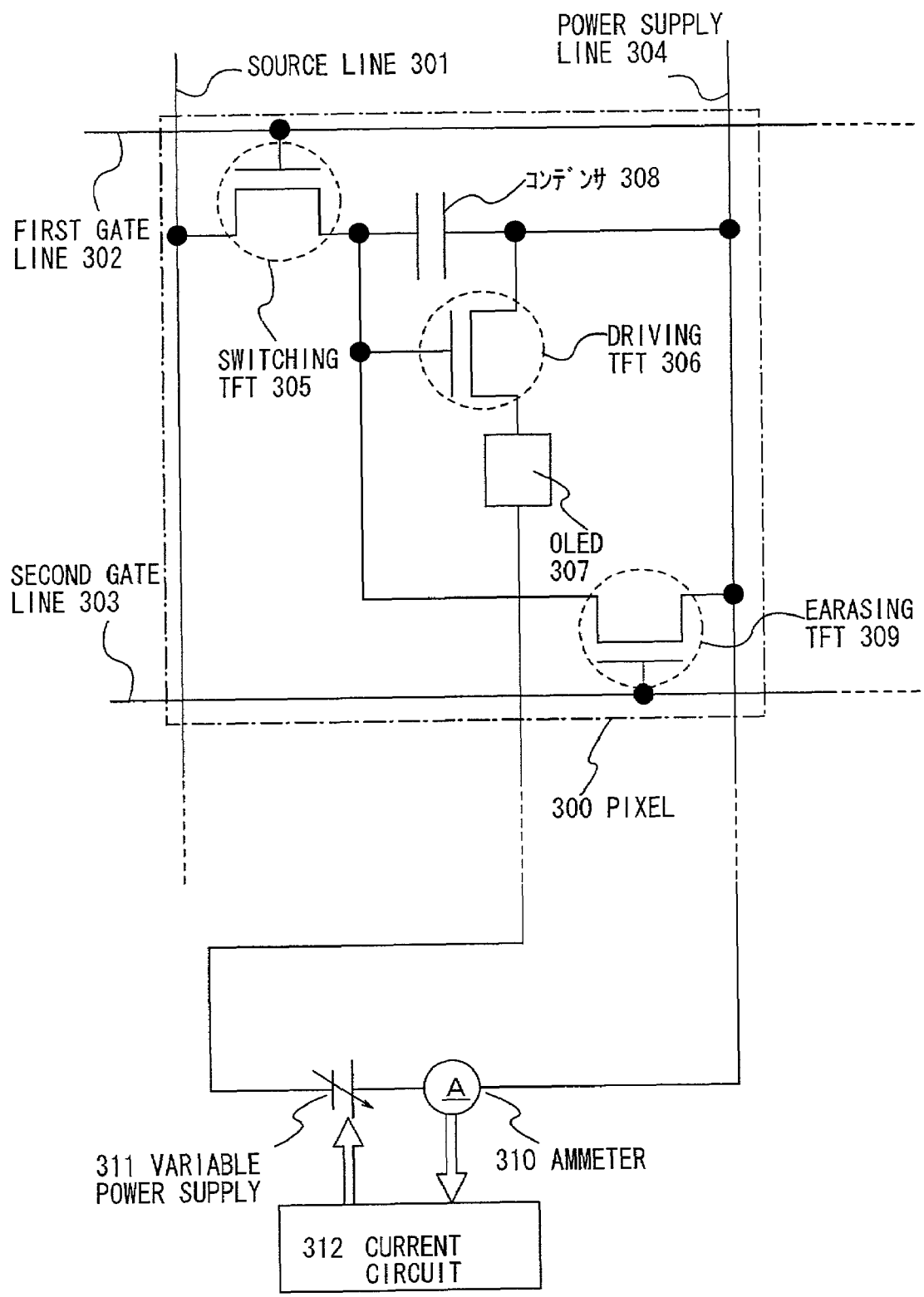
FIG. 8 is a pixel circuit diagram of a light emitting device of the present invention.

FIG. 8 shows the structure of the pixel in this embodiment. In a pixel portion of the light emitting device in this embodiment, pixels 300 are provided in matrix. The pixel 300 has a source line 301, a first gate line 302 a second gate line 303, a power supply line 304, a switching TFT 305, a driving TFT 306, an erasing TFT 309 and an OLED 307.

A gate electrode of the switching TFT 305 is connected to the first gate line 302. One of a source region and a drain region of the switching TFT 305 is connected to the source line 301, and the other is connected to a gate electrode of the driving TFT 306.

A gate electrode of the erasing TFT 309 is connected to the second gate line 303. One of a source region and a drain region of the erasing TFT 309 is connected to the power supply line 304, and the other is connected to the gate electrode of the driving TFT 306.

A source region of the driving TFT 306 is connected to the power supply line 304, and a drain region of the driving TFT 306 is connected to a pixel electrode of the OLED 307. A capacitor 308 is formed between the gate electrode of the driving TFT 306 and the power supply line 304.

The power supply line 304 is connected to a variable power supply 311 through an ammeter 310. Further, opposing electrodes of the OLEDs 307 are all connected to the variable power supply 311. Note that, in FIG. 8, the variable power supply 311 is connected such that the power supply line side is kept at a high potential (Vdd) and the opposing electrode side is kept at a low potential side (Vss). However, the present invention is not limited to this structure. It may be only necessary that the variable power supply 311 is connected such that the current flowing through the OLED 307 has a forward bias.

The ammeter 310 does not necessarily provided between the variable power supply 311 and the power supply line 304, and may be provided between the variable power supply 311 and the opposing electrode.

Reference numeral 312 denotes a correction circuit which controls the voltage supplied to the opposing electrode and the power supply line 304 from the variable power supply 311 based on the current value (measured value) measured with the ammeter 310.

Note that the ammeter 310, the variable power supply 311 and the correction circuit 312 may be formed on the substrate different from the substrate on which the pixel portion is formed, and may be connected to the pixel portion through a connector or the like. If possible, the above-described components may be formed on the same substrate as the pixel portion.

Further, in a color display mode, a variable power supply and an ammeter may be provided for each color, and an OLED driving voltage may be corrected in the OLED of each color. Note that, at this time, the correction circuit may be provided for each color, or the common correction circuit may be provided for the OLEDs of plural colors.

In the pixel shown in FIG. 8, the potentials of the first gate line 302 and the second gate line 303 are controlled by different gate line driver circuits. The source line 301 is input with a video signal or a monitor video signal by a source line driver circuit.

When the switching TFT 305 is turned on, the video signal or the monitor video signal input to the source line 301 is input to the gate electrode of the driving TFT 306 through the switching TFT 301. Then, when the driving TFT 306 is turned on in accordance with the video signal or the monitor video signal, the OLED driving voltage is applied between the pixel electrode and the opposing electrode of the OLED 307 by the variable power supply 311. Thus, the OLED 307 emits light.

Then, when the erasing TFT 309 is turned on, the potential difference between the source region and the gate electrode of the driving TFT 306 becomes close to zero, and the driving TFT 306 is turned off. Thus, the OLED 307 does not emit light.

In the present invention, while the OLED 307 is emitting light, a current is measured in the ammeter 310. The measured value as data is sent to the correction circuit 312.

In the correction circuit 312, the measured value of the current and a fixed current value (reference value) are compared. Then, in the case where there is some difference between the measured value and the reference value, the variable power supply 311 is controlled to correct the voltage between the power supply line 304 and the opposing electrode. Thus, the OLED driving voltage is corrected in the OLED 307 of the pixel 300, and an OLED driving current with a desired size flows.

Note that the OLED driving voltage may be corrected by controlling the potential at the power supply line side, or may be corrected by controlling the potential at the opposing electrode side. Also, the OLED driving voltage may be corrected by controlling both the potential at the power supply line side and the potential at the opposing electrode side.

The structure of the pixel shown in this embodiment is just one example, and the present invention is not limited to this structure. Note that this embodiment can be implemented by freely being combined with Embodiment 1.

[Embodiment 3]

In this embodiment, a monitor image displayed on the pixel portion in performing correction of a current in the light emitting device of the present invention is described.

In the present invention, the correction of the current may be conducted at the time predetermined in advance by setting. Also, a user may arbitrarily determine the time of the correction.

In the case where the correction is performed at the time predetermined in advance by setting, it is preferable from the viewpoint of convenience that the image to be displayed is prevented from being changed against intention of, a user. For example, in case of a portable telephone, the setting is made such that the correction is performed only at the time when a waiting image is displayed. Also, in case of a personal computer (PC), the setting is made such that the correction is performed only at the time while a screen-saver for preventing a screen from burning is being started. A reference value of the current at the time when each screen is displayed is stored in a correction circuit, whereby the correction can be performed such that the image to be displayed is prevented from being changed against intention of a user.

Further, the image displayed at the time when the correction is conducted may be used as the monitor image as it is, and monitor images having different reference current values may be used. In this case, a video signal is also input to the correction circuit, and the reference value is calculated in a calculation circuit or the like. In the case where the monitor image is not used, it is not necessary that a monitor video signal is used, and of course, the image to be displayed is not changed against intention of a user.

This embodiment can be implemented by being freely combined with Embodiment 1 or 2.

[Embodiment 4]

Figure 9:
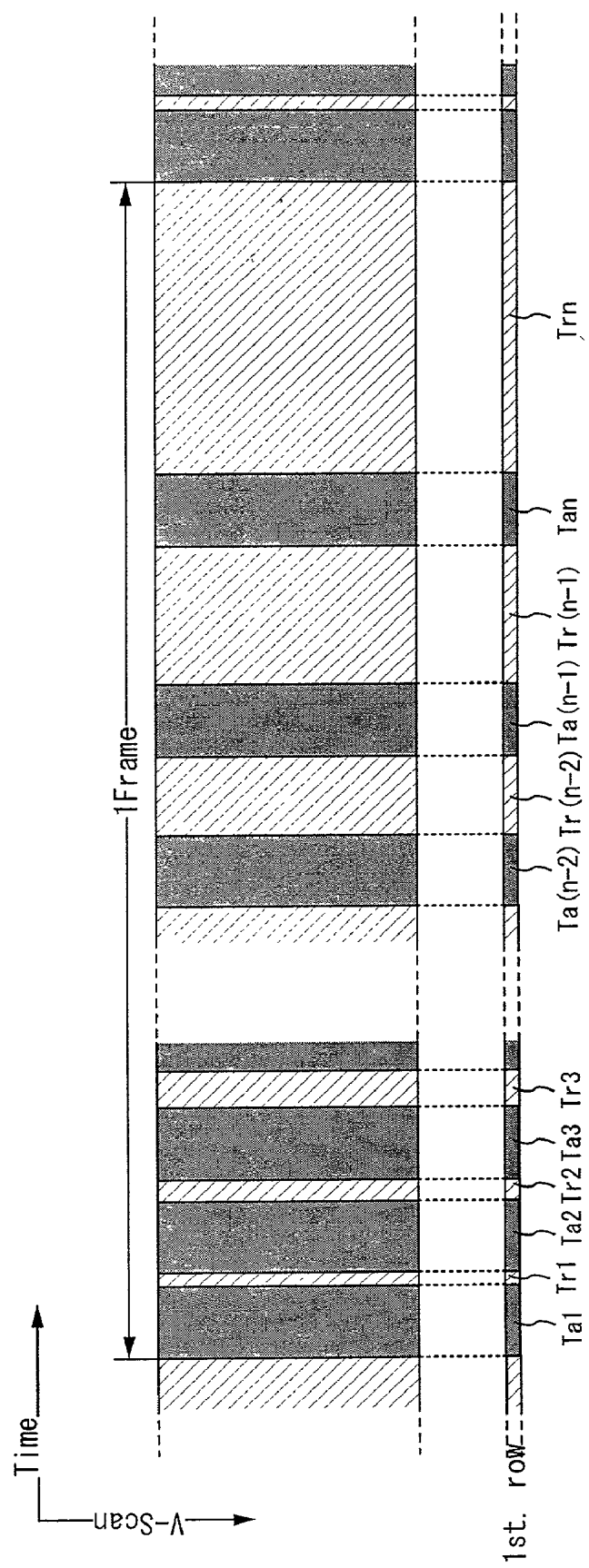
FIG. 9 is a diagram showing a method of driving the light emitting device of the present invention.

In this embodiment, a driving method of the light emitting device of the present invention in FIG. 1 and FIG. 4 is described with reference to FIG. 9. Note that, in FIG. 9, a horizontal axis indicates time and a vertical axis indicates the position of a pixel connected to a gate line.

First, when a writing period Ta is started, the power supply potential of the power supply lines V1 to Vx is kept at the same level as the potential of the opposing electrode of the OLED 105. Then, the switching TFT 110 of each of all the pixels connected to the gate line G1 (pixels of the first line) is turned on in accordance with a selection signal output from the gate line driver circuit 104.

Then, a video signal of digital (hereinafter referred to as digital video signal) of the first bit input to each of the source lines (S1 to Sx) by the source line driver circuit 103 is input to the gate electrode of the driving TFT 111 through the switching TFT 110.

Next, the switching TFT 110 of each pixel of the first line is turned off. Similarly to the pixels of the first line, the switching TFT 110 of each of the pixels of the second line which are connected to the gate line G2 is turned on by the selection signal. Next, the digital video signal of the first bit from each of the source lines (S1 to Sx) is input to the gate electrode of the driving TFT 111 through the switching TFT 110 of each pixel of the second line.

Then, the digital video signals of the first bit are input to the pixels of all the lines in order. The period during which the digital video signals of the first bit are input to the pixels of all the lines is a writing period Ta1. Note that, in this embodiment, that the digital video signal is input to the pixel means that the digital video signal is input to the gate electrode of the driving TFT 111 through the switching TFT 110.

The writing period Ta1 is completed, and then, a display period Tr1 is started. In the display period Tr1, the power supply potential of the power supply line becomes the potential having a potential difference with the opposing electrode with an extent such that the OLED emits light when the power supply potential is given to the pixel electrode of the OLED.

In this embodiment, in the case where the digital video signal has information of "0", the driving TFT 111 is in an off state. Thus, the power supply potential is not given to the pixel electrode of the OLED 105. As a result the OLED 105 of the pixel input with the digital video signal having the information of "0" does not emit light.

On the contrary, in the case where the digital video signal has information of "1", the driving TFT 111 is in an on state. Thus, the power supply potential is given to the pixel electrode of the OLED 105. As a result, the OLED 105 of the pixel input with the digital video signal having the information of "1" emits light.

As described above, the OLED 105 is in an emission state or a non-emission state in the display period Tr1, and all the pixels perform the display. The period during which the pixels perform the display is called a display period Tr. Particularly, the display period which starts by the digital video signals of the first bit being input to the pixels is called the display period Tr1.

The display period Tr1 is completed, and then, a writing period Ta2 is started. The power supply potential of the power supply line again becomes the potential of the opposing electrode of the OLED. Similarly to the case of the writing period Ta1, all the gate lines are selected in order, and the digital video signals of the second bit are input to all the pixels. The period during which the digital video signals of the second bit are input to the pixels of all the lines is called the writing period Ta2.

The writing period Ta2 is completed, and then, a display period Tr2 is started. The power supply potential of the power supply line becomes the potential having the potential difference with the opposing electrode with an extent such that the OLED emits light when the power supply potential is given to the pixel electrode of the OLED. Then, all the pixels perform the display.

The above-described operation is repeatedly performed until the digital video signals of n-th bit are input to the pixels, and the writing period Ta and the display period Tr alternately appears. When all the display periods (Tr1 to Trn) are completed, one image can be displayed. In this specification, a period for displaying one image is called one frame period (F). The one frame period is completed, and then, the next frame period is started. Then, the writing period Ta1 appears again, and the above-described operation is repeated.

In the general light emitting device, it is preferable that 60 or more frame periods are provided for one second. If the number of images displayed for one second is less than 60, a flicker of an image may become visually conspicuous.

In this embodiment, it is necessary that the sum of lengths of all the writing periods is shorter than the one frame period, and also that the ratio of the lengths of the display periods is $Tr1:Tr2:Tr3::Tr(n-1):Trn=2^0:2^1:2^2::2^{(n-2)}:2^{(n-1)}$. The combination of the above display periods enables the display of a desired gradation among $2^n$ gradations.

The total sum of the lengths of the display periods during which the OLED emits light in the one frame period is found, whereby the gradation displayed by the pixel in the frame period concerned is determined. For example, in case of n=8. it is assumed that the luminance in the case where the pixel emits light in all the display periods is 100%. When the pixel emits light in Tr1 and Tr2, a luminance of 1% can be exhibited. When Tr3, Tr5 and Tr8 are selected, a luminance of 60% can be exhibited.

Further, the display periods Tr1 to Trn may be appeared in any order. For example, the display periods may be appeared in the order of Tr1, Tr3, Tr5, Tr2, in the one frame period.

Note that, although the height of the power supply potential of the power supply line is changed between the writing periods and the display periods in this embodiment, the present invention is not limited to this. Both the power supply potential and the potential of the opposing electrode may always have the potential difference with an extent such that the OLED emits light when the power supply potential is given to the pixel electrode of the OLED. In this case, the OLED can be made to emit light also in the writing periods. Thus, the gradation displayed by the pixel in the frame period concerned is determined based on the total sum of the lengths of the writing periods and the display periods during which the OLED emits light in the one frame period. Note that, in this case, the ratio of the sums of the lengths of the writing periods and the display periods corresponding to the digital video signals of respective bits needs to be $(Ta1+Tr1):(Ta2+Tr2):(Ta3+Tr3)::(Ta(n-1)+Tr(n-1)):(Tan+Trn)=2^0:2^1:2^2::2^{(n-2)}:2^{(n-1)}$.

Note that the driving method shown in this embodiment is just one example, and the driving method of the light emitting device of the present invention in FIG. 1 and FIG. 4 is not limited to the driving method in this embodiment. The light emitting device of the present invention shown in FIG. 1 and FIG. 4 can perform the display with analogue video signals.

Note that this embodiment can be implemented by being freely combined with Embodiment 1 or 3.

[Embodiment 5]

This embodiment describes a specific structure of a gate line driver circuit and a source line driver circuit to drive the pixel portion of a light emitting device of the present invention.

Figure 10A:
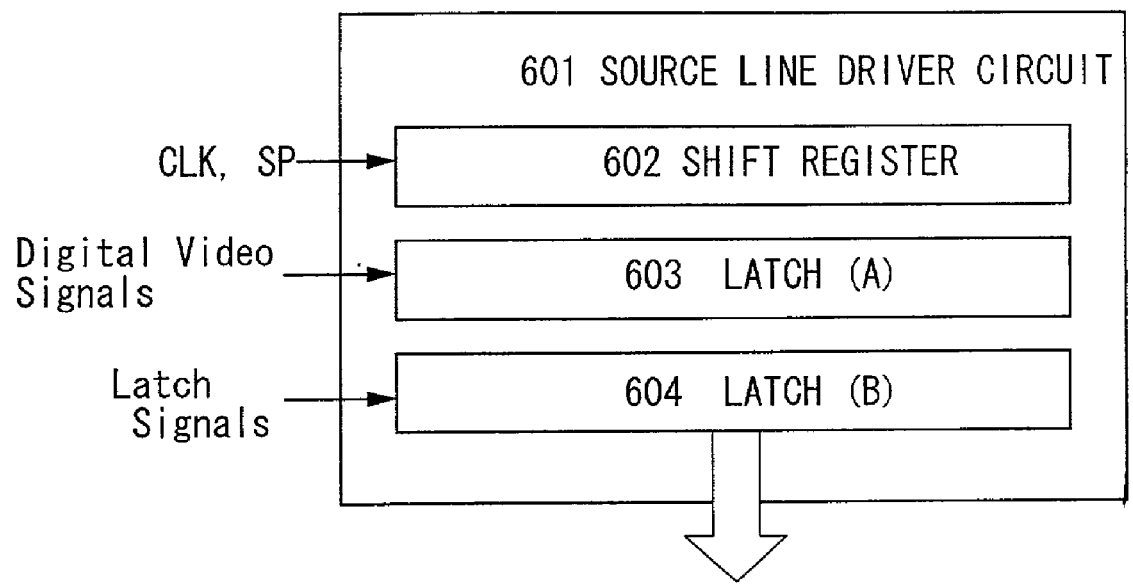
FIGS. 10A and 10B are block diagrams of driver circuits.

FIG. 10 shows a driver circuit of the light emitting device by a block figure. In FIG. 10A, the reference numeral 601 is a source signal line driver circuit which has the shift register 602, the latch (A) 603 and the latch (B) 604.

A clock signal (CLK) and a start pulse (SP) are inputted to the shift register 602 in the source signal line driving circuit 601. The shift register 602 generates timing signals in order based upon the clock signal (CLK) and the start pulse (SP), and the timing signals are supplied one after another to downstream circuits through a buffer (not shown in the figure).

Note that the timing signals from the shift register 602 may be buffer-amplified by a circuit such as a buffer. The load capacitance (parasitic capacitance) of a wiring to which the timing signals are supplied is large because many of the circuits and elements are connected to the wiring. The buffer is formed in order to prevent dullness in the rise and fall of the timing signal, generated due to the large load capacitance. In addition, the buffer is not always necessary formed.

The timing signals which is a buffer-amplified are supplied to the latch (A) 603. The latch (A) 603 has a plurality of latch stages for processing a digital video signal. The latch (A) 603 writes in and maintains a digital video signal which is supplied by the external of the source signal line driver circuit 601 in order simultaneously with the input of the above-mentioned timing signals.

Note that the digital video signals may be sequentially inputted to the plurality of latch stages of the latch (A) 603 when the digital signals are taken in by the latch (A) 603. However, the present invention is not limited to this structure. A so-called division drive may be performed, that is, the plurality of latch stages of the latch (A) 603 is divided into a number of groups, and then the digital video signals are parallel inputted to the respective groups at the same time. Note that the number of groups at this point is called a division number. For example, if the latch circuits are grouped into 4 stages each, then it is called a 4-branch division drive.

The time necessary to complete writing of the digital video signals into all the latch stages of the latch (A) 603 is called a line period. In fact, the above-defined line period added with the horizontal retrace period may also be referred to as the line period.

After the completion of one line period, a latch signal is supplied to the latch (B) 604. In this moment, the digital signals written in and held by the latch (A) 603 are sent all at once to the latch (B) 604 to be written in and held by all the latch stages thereof.

Sequential writing-in of digital video signals on the basis of the timing signals from the shift register 602 is again carried out to the latch (A) 603 after it has completed sending the digital video signals to the latch (B) 604.

During this second time one line period, the digital video signals written in and held by the latch (B) 604 are inputted to the source signal lines.

Figure 10B:
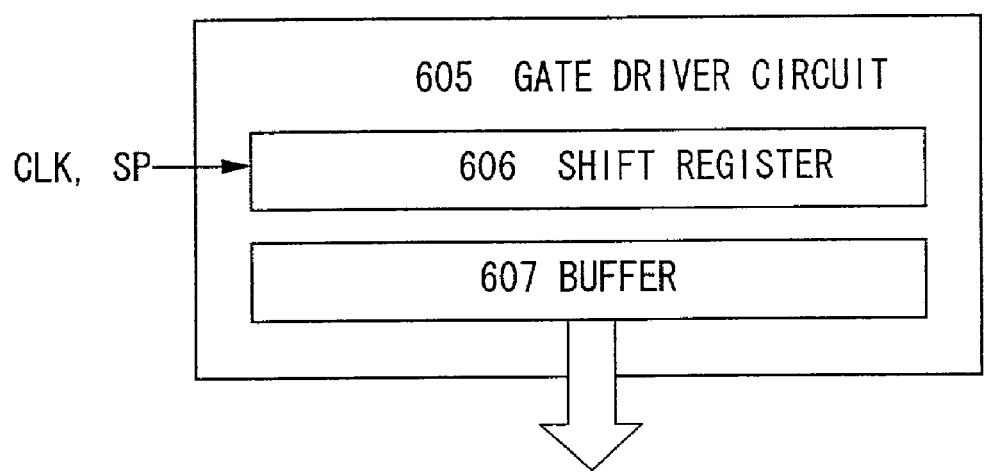

FIG. 10B is a block figure which is showing a structure of the gate signal line driver circuit.

The gate signal driver circuit 605 has a shift register 606 and a buffer 607. According to circumstances, the level shifter can be provided.

In the gate signal line driving circuit 605, the timing signal is supplied to the buffer 607 from the shift register 606, and this is supplied to a corresponding gate signal line. Gate electrodes of the switching TFTs of one line portion of pixels are connected to each of the gate signal lines. All of the switching TFTs of the one line portion of pixels must be placed in an ON state simultaneously, and therefore a buffer in which a large electric current can flow is used.

Note that the driving circuit shown in this embodiment is just one example, and this embodiment can be implemented by being freely combined with Embodiment 1 to 4.

[Embodiment 6]

In this embodiment, an appearance of the light emitting device of the present invention is described with reference to FIGS. 11A to 11C.

Figure 11A:
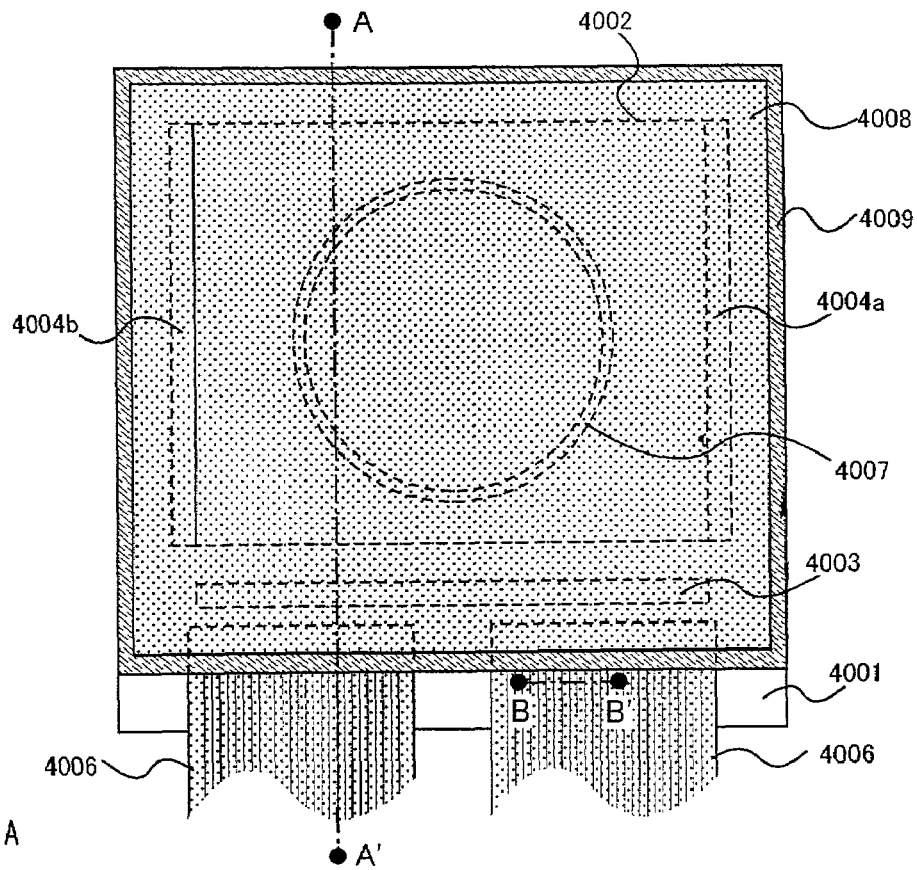
FIGS. 11A to 11C show an appearance of the light emitting device of the present invention.
Figure 11B:
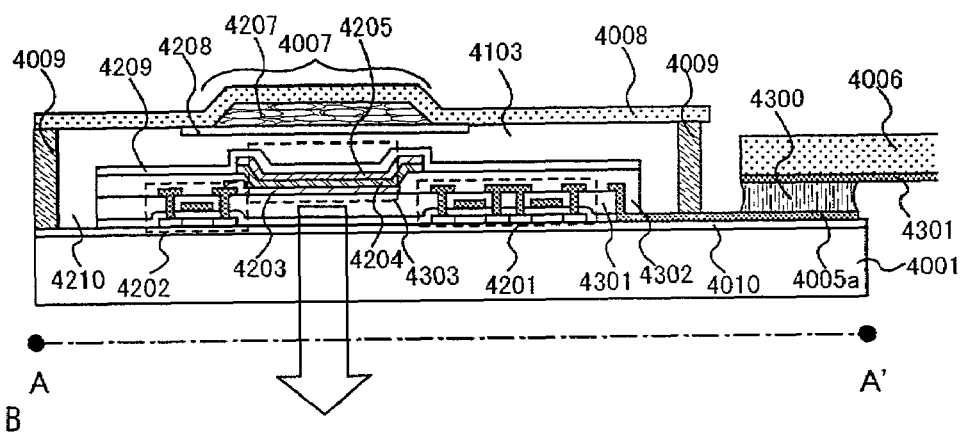
Figure 11C:
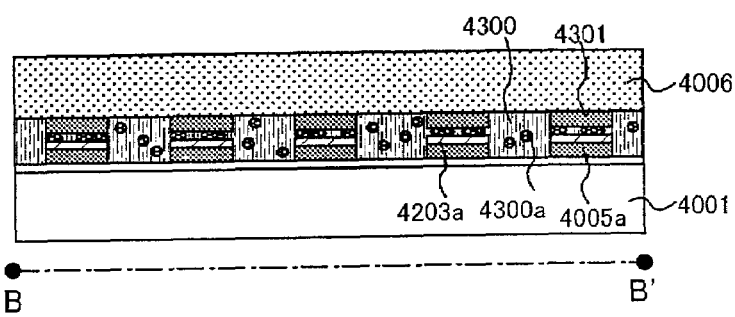

FIG. 11A is a top view of the light emitting device, FIG. 11B is a cross sectional view taken along with a line A–A' of FIG. 11A, and FIG. 11C is a cross sectional view taken along with a line B–B' of FIG. 11A.

A seal member 4009 is provided so as to surround a pixel portion 4002, a source line driver circuit 4003 and first and second gate line driver circuits 4004a and 4004b, which are provided on a substrate 4001. Further, a sealing material 4008 is provided on the pixel portion 4002, the source line driver circuit 4003 and the first and second gate line driver circuits 4004a and 4004b. Thus, the pixel portion 4002, the source line driver circuit 4003 and the first and second gate line driver circuits 4004a and 4004b are sealed by the substrate 4001, the seal member 4009 and the sealing material 4008 together with a filler 4210.

Further, the pixel portion 4002, the source line driver circuit 4003 and the first and second gate line driver circuits 4004a and 4004b, which are provided on the substrate 4001, have a plurality of TFTs. In FIG. 11B, a driver circuit TFT (Here, an n-channel TFT and a p-channel TFT are shown in the figure.) 4201 included in the source line driver circuit 4003 and a driving TFT (TFT for controlling the current to the OLED) 4202 included in the pixel portion 4002, which are formed on a base film 4010, are typically shown.

In this embodiment, the p-channel TFT or the n-channel TFT manufactured by a known method is used as the driver circuit TFT 4201, and the p-channel TFT manufactured by a known method is used as the driving TFT 4202. Further, the pixel portion 4002 is provided with a storage capacitor (not shown) connected to a gate electrode of the driving TFT 4202.

An interlayer insulating film (leveling film) 4301 is formed on the driver circuit TFT 4201 and the driving TFT 4202, and a pixel electrode (anode) 4203 electrically connected to a drain of the driving TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light emitting layer 4204 is formed on the pixel electrode 4203. A known organic light emitting material or inorganic light emitting material may be used for the organic light emitting layer 4204. Further, there exist a low molecular weight (monomer) material and a high molecular weight (polymer) material as the organic light emitting materials, and both the materials may be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the above-described film deposition is enabled by using a multichamber type (cluster tool type) film forming device. In addition, a predetermined voltage is given to the cathode 4205.

As described above, an OLED 4303 constituted of the pixel electrode (anode) 4203, the organic light emitting layer 4204 and the cathode 4205 is formed. Further, a protective film 4209 is formed on the insulating film 4302 so as to cover the OLED 4303. The protective film 4209 is effective in preventing oxygen, moisture and the like from permeating the OLED 4303.

Reference numeral 4005a denotes a wiring drawn to be connected to the power supply line, and the wiring 4005a is electrically connected to a source region of the driving TFT 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4103, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4103 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

As shown in FIG. 11C, the pixel electrode 4203 is formed and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

The ammeter, the variable power supply and the correction circuit of the light emitting device of the present invention are formed on a substrate (not shown) different from the substrate 4001, and are electrically connected to the power supply line and the cathode 4205, which are formed on the substrate 4001, through the FPC 4006.

Note that this embodiment can be implemented by being freely combined with Embodiments 1 to 5.

[Embodiment 7]

In this embodiment, an example is described in which the ammeter, the variable power supply and the correction circuit of the light emitting device of the present invention are formed on a substrate different from the substrate on which the pixel portion is formed, and are connected to the wirings on the substrate on which the pixel portion is formed by a means such as a wire bonding method or a COG (chip-on-glass) method.

Figure 12:
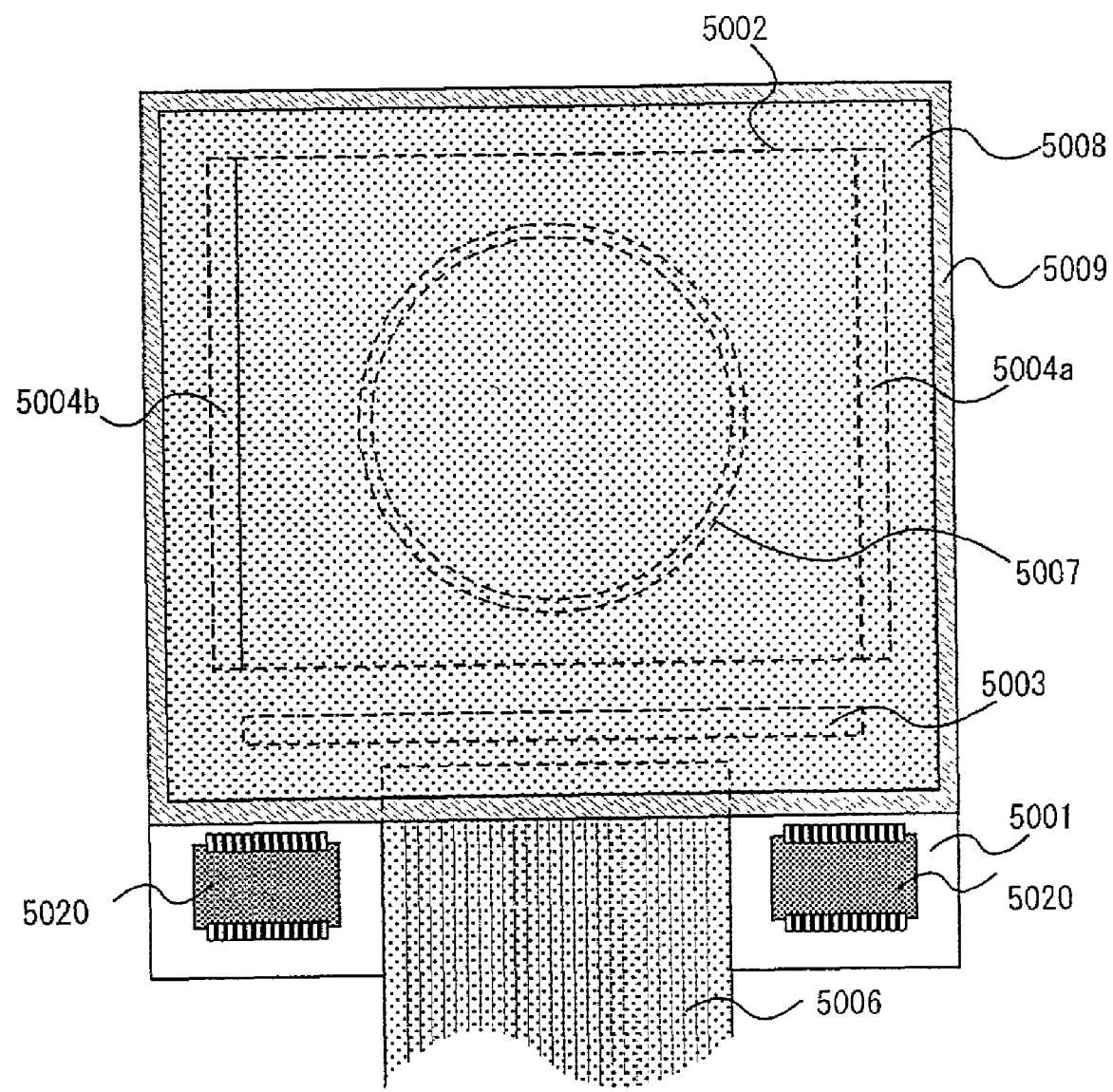
FIG. 12 shows an appearance of the light emitting device of the present invention.

FIG. 12 is a diagram of an appearance of a light emitting device of this embodiment. A seal member 5009 is provided so as to surround a display pixel portion 5002, a source line driver circuit 5003 and first and second gate line driver circuits 5004a and 5004b which are provided on a substrate 5001. Further, a sealing material 5008 is provided on the pixel portion 5002, the source line driver circuit 5003 and the first and second gate line driver circuits 5004a and 5004b. Thus, the pixel portion 5002, the source line driver circuit 5003 and the first and second gate line driver circuits 5004a and 5004b are sealed by the substrate 5001, the seal member 5009 and the sealing member 5008 together with a filler (not shown).

A concave portion 5007 is provided on the surface of the sealing material 5008 on the substrate 5001 side, and a hygroscopic substance or a substance that can absorb oxygen is arranged therein.

A wiring (drawn wiring) drawn onto the substrate 5001 passes between the seal member 5009 and the substrate 5001, and is connected to an external circuit or element of the light emitting device through an FPC 5006.

The ammeter, the variable power supply and the correction circuit of the light emitting device of the present invention are formed on a substrate (hereinafter referred to as chip) 5020 different from the substrate 5001. The chip 5020 is attached onto the substrate 5001 by the means such as the COG (chip-on-glass) method, and is electrically connected to the power supply line and a cathode (not shown) which are formed on the substrate 5001.

In this embodiment, the chip 5020 on which the ammeter, the variable power supply and the correction circuit are formed is attached onto the substrate 5001 by the wire bonding method, the COG method or the like. Thus, the light emitting device can be structured based on one substrate, and therefore, the device itself is made compact and also the mechanical strength is improved.

Note that a known method can be applied with regard to a method of connecting the chip onto the substrate. Further, circuits and elements other than the ammeter, the variable power supply and the correction circuit may be attached onto the substrate 5001.

This embodiment can be implemented by being freely combined with Embodiments 1 to 6.

[Embodiment 8]

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

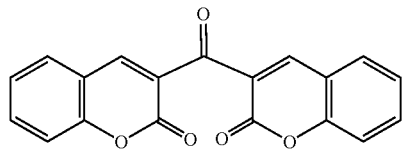

(M. A. Baldo, D. F. O Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

(Chemical formula 2)

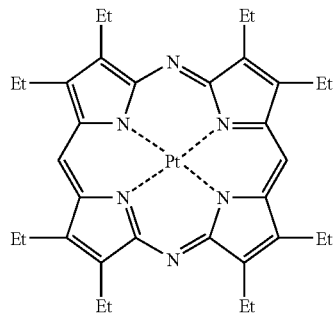

(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical Formula 3)

(Chemical formula 3)

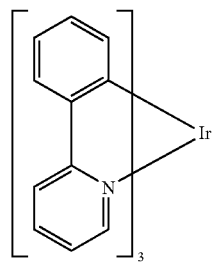

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiment 1 to 11.

[Embodiment 9]

This embodiment describes an example of the method of manufacturing a light emitting device of the present invention in FIGS. 13 to 15. The method of manufacturing a switching TFT of a pixel portion, a driver TFT and TFT of driver portion formed on the periphery of the pixel portion at the same time is described in this embodiment in according to the steps.

First, this embodiment uses a substrate 900 made of barium borosilicate glass, typically Corning #7059 glass and #1737 glass (products of Corning Incorporated), or alumino borosilicate glass. No limitation is put to the material of the substrate 900 as long as it is light-transmissive, and a quartz substrate may be used. A plastic substrate may also be used if it can withstand heat at the process temperature of this embodiment.

Figure 13A:
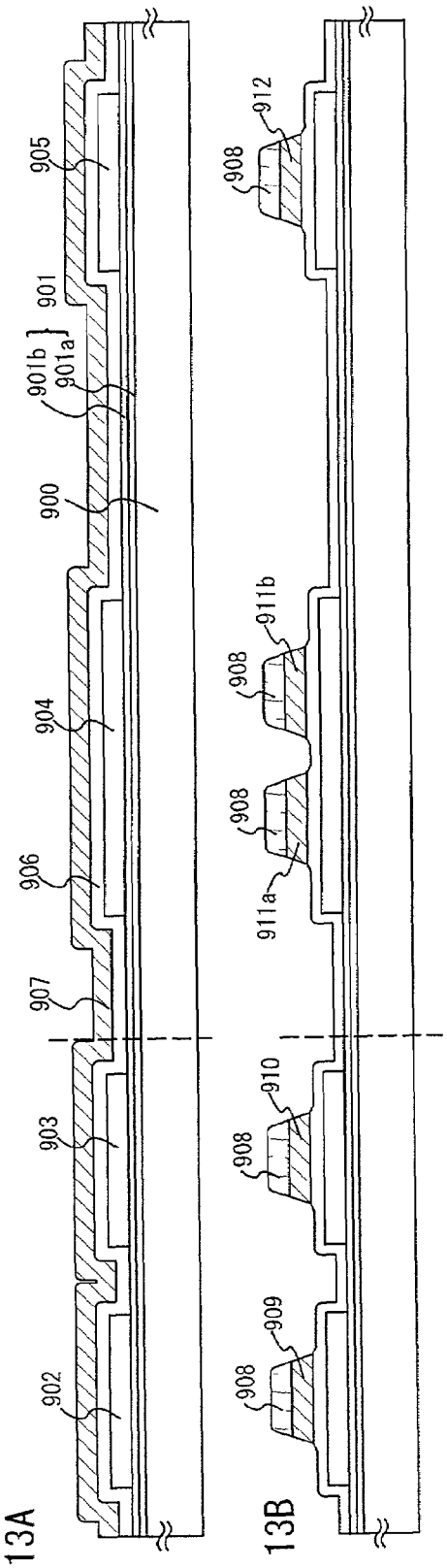
FIGS. 13A to 13D show a method of manufacturing the light emitting device of the present invention.

Next, as shown in FIG. 13A, a base film 901 is formed on the substrate 900 from an insulating film such as a silicon oxide film, a silicon nitride film, and a silicon oxynitride film. In this embodiment, the base film 901 has a two-layer structure but it may be a single layer or a laminate of the above insulating films. The first layer of the base film 901 is a silicon oxynitride film 901a formed by plasma CVD using as reaction gas $SiH_4$, $NH_3$, and $N_2O$ to have a thickness of 10 to 200 nm (preferably 50 to 100 nm). In this embodiment, the silicon oxynitride film 901a (composition ratio: Si=32%, O=27%, N=24%, H=17%) is 50 nm in thickness. The second layer of the base film 901 is a silicon oxynitride film 901b formed by plasma CVD using as reaction gas $SiH_4$ and $N_2O$ to have a thickness of 50 to 200 nm (preferably 100 to 150 nm). In this embodiment, the silicon oxynitride film 901b (composition ratio: Si=32%, O=59%, N=7%, H=2%) is 100 nm in thickness.

On the base film 901, semiconductor layers 902 to 905 are formed. The semiconductor layers 902 to 905 are formed by patterning into a desired shape a crystalline semiconductor film that is obtained by forming a semiconductor film with an amorphous structure through a known method (sputtering, LPCVD, or plasma CVD) and then by subjecting the amorphous film to a known crystallization treatment (laser crystallization, thermal crystallization, or thermal crystallization using nickel or other catalyst). The semiconductor layers 902 to 905 are each 25 to 80 nm in thickness (preferably 30 to 60 nm). Although the material of the crystalline semiconductor film is not limited, silicon, silicon germanium ($Si_xGe_{1-x}$(X=0.0001 to 0.02)) alloy or the like is preferred. In this embodiment an amorphous silicon film with a thickness of 55 nm is formed by plasma CVD and then a solution containing nickel is held to the top face of the amorphous silicon film. The amorphous silicon film is dehydrated (at 500° C. for an hour), then subjected to thermal crystallization (at 550° C. for four hours), and then subjected to laser annealing treatment for improving crystallinity, thereby obtaining the crystalline silicon film. The crystalline silicon film receives patterning treatment by photolithography to form the semiconductor layers 902 to 905.

After the semiconductor layers 902 to 905 are formed., the semiconductor layers 902 to 905 may be doped with a minute amount of impurity element (boron or phosphorus) in order to control the threshold of the TFTs.

If laser crystallization is used to form the crystalline semiconductor film, a pulse oscillation type or continuous wave type excimer layer. YAG laser, or YVO$_4$ laser may be used. When using these lasers, it is appropriate to use an optical system to collect laser light emitted from the laser oscillator into a linear beam before irradiating the semiconductor film. Although conditions of crystallization can be chosen suitably by an operator, preferred conditions are as follows. When an excimer laser is used, the pulse: oscillation frequency is set to 300 Hz and the laser energy density is set to 100 to 400 mJ/cm$^2$ (typically, 200 to 300 mJ/cm$^2$). When a YAG laser is employed, the second harmonic thereof is used, the pulse oscillation frequency is set to 30 to 300 Hz, and the laser energy density is set to 300 to 600 mJ/cm$^2$ (typically. 350 to 500 mJ/cm$^2$). The laser light collected into a linear shape is 100 to 1000 μm in width, 400 μm, for example, and the entire surface of the substrate is irradiated with the beam. The overlapping ratio of the linear laser light during irradiation is set to 50 to 90%.

Next, a gate insulating film 906 is formed to cover the semiconductor layers 902 to 905. The gate insulating film 906 is an insulating film containing silicon and formed by plasma CVD or sputtering to have a thickness of 40 to 150 nm. In this embodiment, a silicon oxynitride film (composition ratio: Si=32%, O=59%, N=7%, H=2%) with a thickness of 110 nm is formed by plasma CVD. The gate insulating film is not limited to the silicon oxynitride film, of course, and may be a single layer or a laminate of other insulating films containing silicon.

When a silicon oxide film is used, plasma CVD is employed in which electric discharge is made using a mixture of TEOS (tetraethyl orthosilicate) and O$_2$ and setting the reaction pressure to 40 Pa, the substrate temperature to 300 to 400° C., and the high frequency (13.56 MHZ) power density to 0.5 to 0.8 W/cm$^2$. The thus formed silicon oxide film can provide excellent characteristics as a gate insulating film if it receives subsequent thermal annealing at 400 to 500° C.

On the gate insulating film 906, a heat resistant conductive layer 907 for forming gate electrodes is formed to have a thickness of 200 to 400 nm (preferably 250 to 350 nm). The heat resistant conductive film 907 may be a single layer or may take a laminate structure having a plurality of layers, such as a two-layer structure or a three-layer structure, if necessary. The heat resistant conductive layer contains an element selected from the group consisting of Ta, Ti, and W, or an alloy having the above elements as its ingredient, or an alloy film having the above elements in combination. The heat resistant conductive layer is formed by sputtering or CVD. In order to lower the resistance, the concentration of impurities contained in the layer is preferably reduced. The oxygen concentration in particular, is preferably 30 ppm or less. In this embodiment, a W film with a thickness of 300 nm is formed. The W film may be formed by sputtering with W as the target, or by thermal CVD using tungsten hexafluoride (WF$_6$). Either way, the W film has to be low in resistance to use it as gate electrodes, and the resistivity of the W film is preferably set to 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film during formation. As a result, the W film can have a resistivity of 9 to 20 μΩcm.

The heat resistant conductive layer 907 may instead be a Ta film, which similarly can be formed by sputtering. Ar is used as sputtering gas when forming a Ta film. If an appropriate amount of Xe or Kr is added to the sputtering gas, the internal stress of the film to be formed is eased and thus the film is prevented from peeling off. The resistivity of a Ta film in α phase is about 20 μΩcm and is usable for a gate electrode. On the other hand, the resistivity of a Ta film in β phase is about 180 μΩcm and is not suitable for a gate electrode. A Ta film in α phase can readily be obtained by forming a TaN film as a base of a Ta film because a TaN film has a crystal structure approximate to that of the α phase Ta film. Although not shown in the drawings, it is effective to form a silicon film doped with phosphorus (P) to have a thickness of about 2 to 20 nm under the heat resistant conductive layer 907. This improves adhesion to the conductive film formed thereon and prevents oxidation of the conductive film and, at the same time, prevents alkaline metal elements contained in a minute amount in the hat resistant conductive layer 907 from diffusing into the first shape gate insulating film 906. In either case, the resistivity of the heat resistant conductive layer 907 is preferably set to 10 to 50 μΩcm.

Next, resist masks 908 are formed using the photolithography technique. Then first etching treatment is conducted. In this embodiment, an ICP etching device is employed, CF$_4$ and Cl$_2$ are mixed as etching gas, and an RF (13.56 MHZ) power of 3.2 W/cm$^2$ is given at a pressure of 1 Pa to generate plasma. The substrate side (sample stage) also receives an RF (13.56 MHZ) power of 224 mW/cm$^2$ so that a substantially negative self-bias voltage is applied. Under these conditions, the etching rate of the W film is about 100 nm/min. On the basis of this etching rate, the time necessary to etch the W film is estimated. The estimated time is extended by 20% and this is the etching time for the first etching treatment.

Figure 13B:
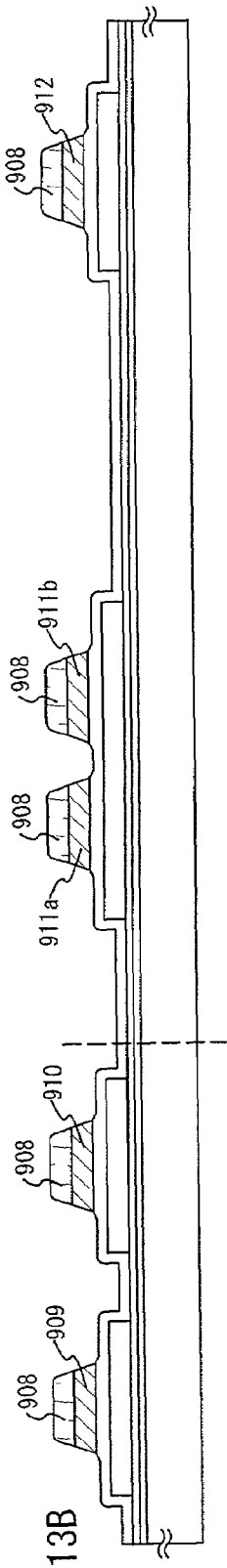

Through the first etching treatment, conductive layers 909 to 912 having a first taper shape are formed. The angle of the tapered portions of the conductive layers 909 to 912 is 15 to 30°. In order to etch the conductive films without leaving any residue, over-etching is employed in which the etching time is prolonged by about 10 to 20%. The selective ratio of the W film to the silicon oxynitride film (the gate insulating film 906) is 2 to 4 (typically 3), and therefore a region where the silicon oxynitride film is exposed is etched by about 20 to 50 nm by the over-etching treatment (FIG. 13B).

Figure 13C:
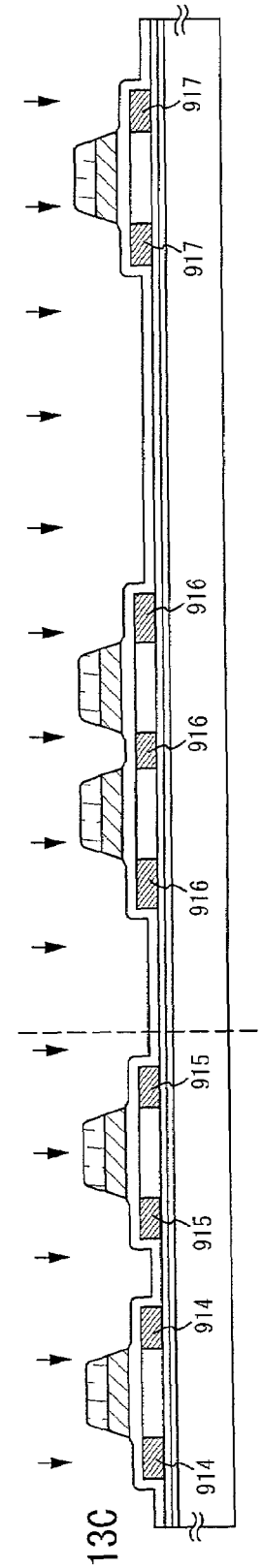

First doping treatment is conducted next to dope the semiconductor layers with an impurity element of one conductivity type. An impurity element giving the n type conductivity is used in this doping step. The masks 908 that have been used to form the first shape conductive layers are left as they are, and the semiconductor layers are doped with an impurity element giving the n type conductivity by ion doping in a self-aligning manner while using the fist taper shape conductive layers 909 to 912 as masks. In the doping, the dose is set to $1\times10^{13}$ to $5\times10^{14}$ atoms/cm$^2$ and the acceleration voltage is set to 80 to 160 keV in order that the impurity element giving the n type conductivity reaches the semiconductor layers below the tapered portions at the edges of the gate electrodes and below the gate insulating film 906 through the tapered portions and the gate insulating film. Used as the impurity element that gives the n type conductivity is an element belonging to Group 15, typically, phosphorus (P) or arsenic (As). Here, phosphorus (P) is used. Through this ion doping, first impurity regions 914 to 917 are formed to contain the impurity element that gives the n type conductivity in a concentration of $1\times10^{20}$ to $1\times10^{21}$ atoms/cm$^3$ (FIG. 13C).

In this step, depending on the doping condition, the impurity may reach under the first shape conductive layers 909 to 912 so that the first impurity regions 914 to 917 overlap the first shape conductive layers 909 to 912.

Figure 13D:
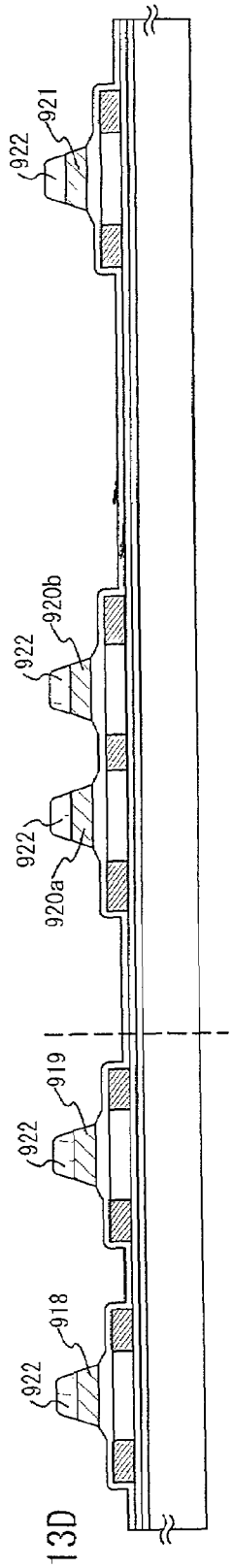

Next, second etching treatment is conducted as shown in FIG. 13D. The second etching treatment also uses the ICP etching device to etch at an RF power of 3.2 W/cm$^2$ (13.56 MHZ), a bias power of 45 mW/cm$^2$ (13.56 MHZ), and a pressure of 1.0 Pa, while using a mixture gas of $CF_4$ and $Cl_2$ as etching gas. Under these conditions, conductive layers 918 to 921 having a second shape are formed. The conductive layers 918 to 921 have tapered portions at the edges and the thickness of the layers is gradually increased from the edges toward the inside. The bias power applied to the substrate side in the second etching treatment is lower than in the first etching treatment and the ratio of isotropic etching is increased that much, thereby setting the angle of the tapered portions to 30 to 60°. The masks 908 are etched to lose the edges and become masks 922. In the step of FIG. 13D, the surface of the gate insulating film 906 is etched by about 40 nm.

Figure 14A:
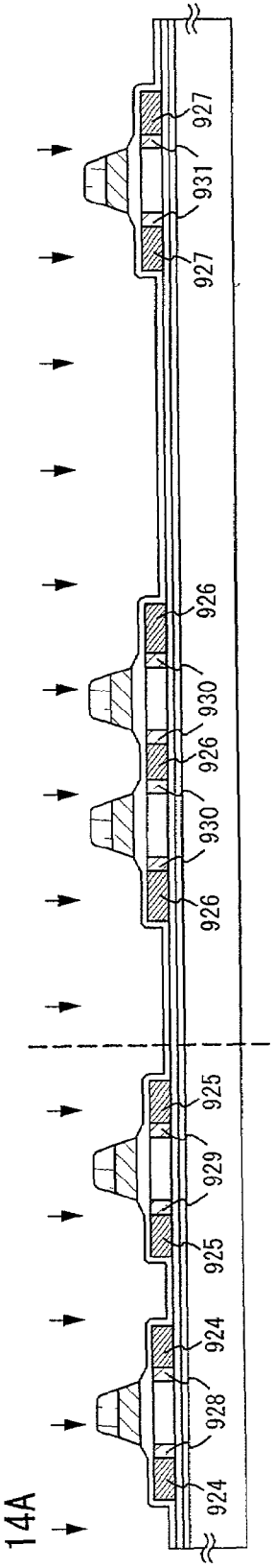
FIGS. 14A to 14C show the method of manufacturing the light emitting device of the present invention.

Then the semiconductor layers are doped with an impurity element that gives the n type conductivity in a dose smaller than in the first doping treatment and at a high acceleration voltage. For example, the acceleration voltage is set to 70 to 120 keV and the dose is set to $1 \times 10^{13}$ atoms/cm$^2$ to form first impurity regions 924 to 927 with increased impurity concentration and second impurity regions 928 to 931 that are in contact with the first impurity regions 924 to 927. In this step, depending on the doping condition, the impurity may reach under the second shape conductive layers 918 to 921 so that the second impurity regions 928 to 931 overlap the second shape conductive layers 918 to 921. The impurity concentration in the second impurity regions is set to $1 \times 10^{16}$ to $1 \times 10^{18}$ atoms/cm$^3$ (FIG. 14A).

Figure 14B:
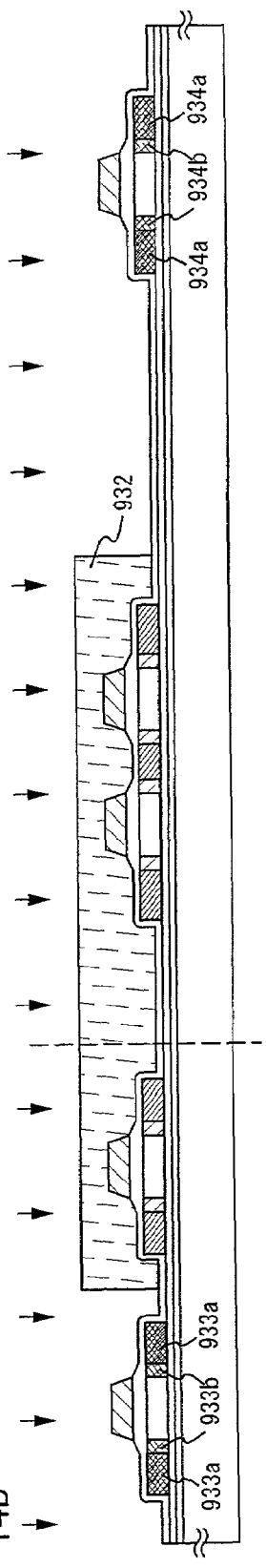

Then as shown in FIG. 14B, impurity regions 933 (933a and 933b) and 934 (934a and 934b) having the conductivity type reverse to the one conductivity type are respectively formed in the semiconductor layers 902 and 905 that are to form p-channel TFTs. In this case also, the semiconductor layers are doped with an impurity element that gives the p type conductivity while using as masks the second shape conductive layers 918 and 921 to form the impurity regions in a self-aligning manner. During this doping, the semiconductor layers 903 and 904 that are to form n-channel TFTs are completely covered with resist masks 932. The impurity regions 933 and 934 here are formed by ion doping using diborane ($B_2H_6$). The concentration of the impurity element that gives the p type conductivity in the impurity regions 933 and 934 is set to $2 \times 10^{20}$ to $2 \times 10^{21}$ atoms/cm$^3$.

When looked at more closely, the impurity regions 933 and 934 can be divided into two regions containing an impurity element that gives the n type conductivity. Third impurity regions 933a and 934a contain the impurity element that gives the n type conductivity in a concentration of $1 \times 10^{20}$ to $1 \times 10^{21}$ atoms/cm$^3$. Fourth impurity regions 933b and 934b contain the impurity element that gives the n type conductivity in a concentration of $1 \times 10^{17}$ to $1 \times 10^{20}$ atoms/cm$^3$. However, the third impurity regions have no problem in functioning as source regions and drain regions of p-channel TFTs if the concentration of the impurity element giving the p type conductivity in the impurity regions 933b and 934b is set to $1 \times 10^{19}$ atoms/cm$^3$ or higher, and if the third impurity regions 933a and 934a contain the impurity element giving the p type conductivity in a concentration 1.5 to 3 times higher than the concentration of the impurity element that gives the n type conductivity.

Figure 14C:
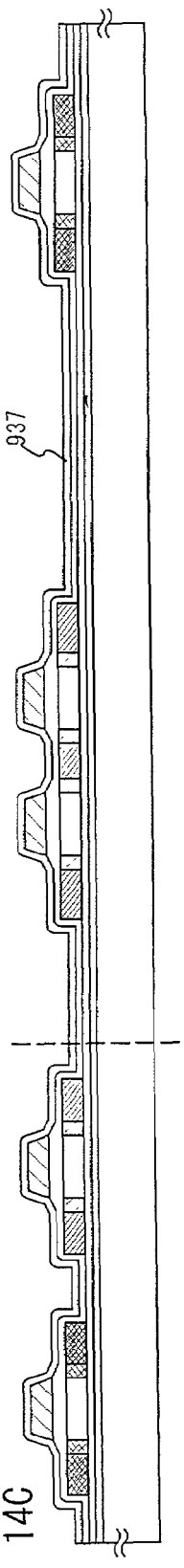

Thereafter, as shown in FIG. 14C, a first interlayer insulating film 937 is formed on the second shape conductive layers 918 to 921 and the gate insulating film 906. The first interlayer insulating film 937 may be a silicon oxide film, a silicon oxynitride film, a silicon nitride film, or a laminate having these films in combination. In either case, the first interlayer insulating film 937 is formed from an inorganic insulating material. The thickness of the first interlayer insulating film 937 is 100 to 200 nm. When a silicon oxide film is used for the first interlayer insulating film 937, plasma CVD is employed in which electric discharge is made using a mixture of TEOS and $O_2$ and setting the reaction pressure to 40 Pa, the substrate temperature to 300 to 400° C., and the high frequency (13.56 MHZ) power density to 0.5 to 0.8 W/cm$^2$. When a silicon oxynitride film is used for the first interlayer insulating film 937, one formed by plasma CVD from $SiH_4$, $N_2O$, and $NH_3$, or one formed by plasma CVD from $SiH_4$ and $N_2O$ is chosen. Film formation conditions in this case include setting the reaction pressure to 20 to 200 Pa, the substrate temperature to 300 to 400° C., and the high frequency (60 MHZ) power density to 0.1 to 1.0 W/cm$^2$. A silicon oxynitride hydrate film formed from $SiH_4$, $N_2O$, and $H_2$ may also be used as the first interlayer insulating film 937. Similarly, a silicon nitride film can be formed by plasma CVD from $SiH_4$ and $NH_3$ as the first interlayer insulating film.

Then the impurity elements used in doping to give the n type and p type conductivities in the respective concentrations are activated. The activation step is carried out by thermal annealing using an annealing furnace. Other activation methods adoptable include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 550° C. for four hours. However, if a plastic substrate weak against heat is used for the substrate 900, laser annealing is preferred.

Following the activation step, the atmosphere gas is changed to one containing 3 to 100% hydrogen and heat treatment is conducted at 300 to 450° C. for one to twelve hours to thereby hydrogenate the semiconductor layers. The hydrogenation step is to terminate dangling bonds contained in the semiconductor layers in $10^{16}$ to $10^{18}$ atoms/cm$^3$, using thermally excited hydrogen. Alternatively, plasma hydrogenation (using hydrogen that is excited by plasma) may be employed. In either case, the defect density in the semiconductor layers 902 to 905 is reduced desirably to $10^{16}$ atoms/cm$^3$ or lower and, to reduce the density to this level, about 0.01 to 0.1 atomic % hydrogen is given.

A second interlayer insulating film 939 is formed next from an organic insulating material to have an average thickness of 1.0 to 2.0 μm. Organic resin materials such as polyimide, acrylic, polyamide, polyimideamide, and BCB (benzocyclobutene) can be used. If polyimide of the type that is thermally polymerized after being applied to a substrate is used, for example, the film is formed by burning the substrate in a clean oven at 300° C. If an acrylic is used, two-pack type is chosen. After the main component is mixed with the curing agent, the resin is applied to the entire surface of the substrate using a spinner, and then the substrate is pre-heated on a hot plate at 80° C. for 60 seconds to be burnt in a clean oven at 250° C. for 60 minutes, thereby forming the insulating film.

When the second interlayer insulating film 939 is thus formed from an organic insulating material, the surface can be leveled satisfactorily. Also, the parasitic capacitance can be reduced since organic resin materials has low dielectric constant in general. However, organic resin materials are hygroscopic and it is therefore preferable to combine the organic resin film with the silicon oxide film, or the silicon oxynitride film, or the silicon nitride film, formed as the first interlayer insulating film 937 as in this embodiment.

Thereafter, a resist mask having a given pattern is formed and contact holes are formed to reach impurity regions that serve as source regions or drain regions in the respective semiconductor layers. The contact holes are formed by dry etching. In this case, a mixture gas of $CF_4$, $O_2$, and He is used as etching gas to etch the second interlayer insulating film 939 formed of an organic resin material first. Then the etching gas is changed to $CF_4$ and $O_2$ to etch the first interlayer insulating film 937. The etching gas is further switched to $CHF_3$ in order to raise the selective ratio with respect to the semiconductor layers, and the gate insulating film 570 is etched to form the contact holes.

A conductive metal film is formed by spattering or vacuum evaporation and patterned using a mask and then etched to form source wiring lines 940 to 943 and drain wiring lines 944 to 946 are formed. Though not shown in the drawings, the wiring lines in this embodiment are a laminate consisting of a Ti film with a thickness of 50 nm and an alloy film (alloy film of Al and Ti) with a thickness of 500 nm.

Next, a transparent conductive film with a thickness of 80 to 120 nm is formed thereon and patterned to form a pixel electrode 947 (FIG. 15A). In this embodiment, an indium tin oxide (ITO) film or a transparent conductive film obtained by mixing 2 to 20% of zinc oxide (ZnO) with indium oxide is used for the transparent electrode.

The pixel electrode 947 overlaps and is in contact with a drain wiring line 946. Thus formed is an electric connection between the pixel electrode 947 and a drain region of a driving TFT.

As shown in FIG. 15B, the third interlayer insulating film 949, which has the opening portion at the position corresponding to pixel electrode 947, is formed. The third interlayer insulating film 949 has a nonconductivity and functions as a bank. Therefore organic compound layer of adjoining pixels is separated by the third interlayer insulating film 949. In this embodiment, resist is used to form the third interlayer insulating film 949.

The third interlayer insulating film 949 is formed with a thickness of approximately 1 µm. The nearer pixel electrode 947 become the more the opening portion broadens. Of course, the third interlayer insulation film 949 is formed as a reverse taper shape. The third interlayer insulating film 949 is formed by covering with a mask where opening portion is not formed, irradiating a ultra violate lay to expose and then removing a exposed position by developing solution.

Because the organic compound layer is divided into parts by the pixel adjoined mutually when the organic compound layer is formed in the following step, it can be suppressed that the organic light emitting layer cracks and peels off even if the thermal expansion coefficient is different between the organic compound layer and the third interlayer insulating film 949.

Although a film made of resist is used as the third interlayer insulating film in this embodiment, a film of an organic resin such as polyimide, polyamide, acrylic. BCB (benzocyclobutene) or silicon oxide film may be used in some cases. If it is a material which has nonconductivity, both the organism and the inorganic substance can be used as the third interlayer insulating film 949.

Next, the organic compound layer 950 is formed by evaporation. A cathode (MgAg electrode) 951 and a protective electrode 952 are also formed by evaporation. Desirably, heat treatment is performed on the pixel electrode 947 to remove moisture completely from the electrode before forming the organic compound layer 950 and the cathode 951. Though the cathode of the light emitting element is a MgAg electrode in this embodiment, other known materials may be used instead.

The organic compound layer 950 can be formed from a known material. In this embodiment, the organic compound layer has a two-layer structure consisting of a hole transporting layer and a light emitting layer. The organic compound layer may additionally have a hole injection layer, an electron injection layer, or an electron transporting layer. Various combinations of these layers have been reported and any of them can be used.

In this embodiment, the hole transporting layer is polyphenylene vinylene deposited by evaporation. The light emitting layer is obtained by evaporation of polyvinyl carbazole with molecular dispersion of 30 to 40% of PBD that is a 1, 3, 4-oxadiazole derivative and by doping the resultant film with about 1% of coumarine 6 as green color luminescence center.

The protective electrode 952 alone can protect the organic compound layer 950 from moisture and oxygen but adding a protective film 953 is more desirable. The protective film 953 in this embodiment is a silicon nitride film with a thickness of 300 nm. The protective electrode and the protective film may be formed in succession without exposing the substrate to the air.

The protective electrode 952 also prevents degradation of the cathode 951. Typically, a metal film containing aluminum as its main ingredient is used for the protective electrode. Other materials may of course be used. The organic compound layer 950 and the cathode 951 are very weak against moisture. Therefore, it is desirable to form them and the protective electrode 952 in succession without exposing the substrate to the air to protect them from the outside air.

The organic compound layer 950 is 10 to 400 nm in thickness (typically 60 to 150 nm). The cathode 951 is 80 to 200 nm in thickness (typically 100 to 150 nm).

Thus completed is a light emitting device having the structure shown in FIG. 15B. A portion 954 where the pixel electrode 947, the organic compound layer 950, and the cathode 951 overlap corresponds to the organic light emitting element.

A p-channel TFT 960 and an n-channel TFT 961 are TFTs of the driving circuit, and constitute a CMOS. A switching TFT 962 and a current controlling TFT 963 are TFTs of the pixel portion. The TFTs of the driving circuit and the TFTs of the pixel portion can be formed on the same substrate.

In the case of a light emitting device using an organic light emitting element, its driving circuit can be operated by a power supply having a voltage of 5 to 6V, 10 V, at most. Therefore, degradation of TFTs due to hot electron is not a serious problem. Also, smaller gate capacitance is preferred for the TFTs since the driving circuit needs to operate at high speed. Accordingly, in a driving circuit of a light emitting device using an organic light emitting element as in this embodiment, the second impurity region 929 and the fourth impurity region 933b of the semiconductor layers of the TFTs preferably do not overlap the gate electrode 918 and the gate electrode 919, respectively.

The method of manufacturing the light emitting device of the present invention is not limited to the one described in this embodiment. The TFTs of the light emitting device of the present invention may be manufactured by a known method.

This embodiment may be combined freely with Embodiments 1 through 8.

[Embodiment 10]

This embodiment describes an example of the method of manufacturing a light emitting device different from embodiment 9.

Steps up through the step of forming the second interlayer insulating film 939 are the same as in Embodiment 5. After the second interlayer insulating film 939 is formed, a passivation film 981 is formed such that it is in contact with the second interlayer insulating film 939 as shown in FIG. 16A.

The passivation film 981 is effective in preventing moisture contained in the second interlayer insulating film 939 from seeping into the organic compound layer 950 through the pixel electrode 947 and a third interlayer insulating film 982. Providing the passivation film 981 is effective especially when the second interlayer insulating film 939 has an organic resin material since organic resin materials contain a lot of moisture.

In this embodiment, a silicon nitride film is used as the passivation film 981.

Thereafter, a resist mask having a given pattern is formed and contact holes are formed to reach impurity regions that serve as source regions or drain regions in the respective semiconductor layers. The contact holes are formed by dry etching. In this case, a mixture gas of $CF_4$, $O_2$, and He is used as etching gas to etch the second interlayer insulating film 939 formed of an organic resin material first. Then the etching gas is changed to $CF_4$ and $O_2$ to etch the first interlayer insulating film 937. The etching gas is further switched to $CHF_3$ in order to raise the selective ratio with respect to the semiconductor layers, and the third shape gate insulating film 570 is etched to form the contact holes.

Further, a conductive metal film is formed by sputtering or vacuum evaporation and is patterned using a mask. The film is then etched to form source wiring lines 940 to 943 and drain wiring lines 944 to 946. Though not shown in the drawings, the wiring lines in this embodiment are a laminate of a Ti film with a thickness of 50 nm and an alloy film (alloy film of Al and Ti) with a thickness of 500 nm.

A transparent conductive film is formed thereon to have a thickness of 80 to 120 nm and is patterned to form the pixel electrode 947 (FIG. 16A). This embodiment uses as the transparent electrode an indium tin oxide (ITO) film or a transparent conductive film obtained by mixing 2 to 20% of zinc oxide (ZnO) with indium oxide.

The pixel electrode 947 is electrically connected to a drain region of a driving TFT by forming the pixel electrode such that it contacts and overlaps the drain wiring line 946.

Next, the third interlayer insulating film 982 having an aperture at a position that coincides with the pixel electrode 947 is formed as shown in FIG. 16B. This embodiment uses dry etching in forming the aperture, thereby shaping it into tapered side walls. Unlike the case shown in Embodiment 5, organic compound layers to be formed on the third interlayer insulating film 982 are not separated from each other. Therefore side walls of the aperture have to be tapered gently. Otherwise degradation of organic compound layers caused by the level difference will be a serious problem.

Although a silicon oxide film is used in this embodiment as the third interlayer insulating film 982, a film of an organic resin such as polyimide, polyamide, acrylic, or BCB (benzocycrobutene) may be used in some cases.

Preferably, plasma treatment using argon is performed on the surface of the third interlayer insulating film 982 before forming the organic compound layer 950 on the third interlayer insulating film 982, thereby increasing the density of the surface of the third interlayer insulating film 982. With the above structure moisture from the third interlayer insulating film 982 is prevented from seeping into the organic compound layer 950.

The organic compound layer 950 is formed by evaporation. A cathode (MgAg electrode) 951 and a protective electrode 952 are also formed by evaporation. Desirably, heat treatment is performed on the pixel electrode 947 to remove moisture completely from the electrode before forming the organic compound layer 950 and the cathode 951. Though the cathode of the light emitting element is a MgAg electrode in this embodiment, other known materials may be used instead.

The organic compound layer 950 can be formed from a known material. In this embodiment, the organic compound layer has a two-layer structure consisting of a hole transporting layer and a light emitting layer. The organic compound layer may additionally have a hole injection layer, an electron injection layer or an electron transporting layer. Various combinations of these layers have been reported and any of them can be used.

In this embodiment, the hole transporting layer is polyphenylene vinylene deposited by evaporation. The light emitting layer is obtained by evaporation of polyvinyl carbazole with molecular dispersion of 30 to 40% of PBD that is a 1, 3, 4-oxadiazole derivative and by doping the resultant film with about 1% of coumarine 6 as green color luminescence center.

The protective electrode 952 alone can protect the organic compound layer 950 from moisture and oxygen but adding a protective film 953 is more desirable. The protective film 953 in this embodiment is a silicon nitride film with a thickness of 300 nm. The protective electrode and the protective film may be formed in succession without exposing the substrate to the air.

The protective electrode 952 also prevents degradation of the cathode 951. Typically, a metal film containing aluminum as its main ingredient is used for the protective electrode. Other materials may of course be used. The organic compound layer 950 and the cathode 951 are very weak against moisture. Therefore, it is desirable to form them and the protective electrode 952 in succession without exposing the substrate to the air to protect them from the outside air.

The organic compound layer 950 is 10 to 400 nm in thickness (typically 60 to 150 nm). The cathode 951 is 80 to 200 nm in thickness (typically 100 to 150 nm).

Thus completed is a light emitting device structured as shown in FIG. 16B. A portion 954 where the pixel electrode 947, the organic compound layer 950, and the cathode 951 overlap corresponds to the light emitting element.

A p-channel TFT 960 and an n-channel TFT 961 are TFTs of the driving circuit and constitute a CMOS. A switching TFT 962 and a driving TFT 963 are TFTs of the pixel portion. The TFTs of the driving circuit and the TFTs of the pixel portion can be formed on the same substrate.

The method of manufacturing the light emitting device of the present invention is not limited to the one described in this embodiment. The TFTs of the light emitting device of the present invention may be manufactured by a known method.

This embodiment may be combined freely with Embodiments 1 through 9.

[Embodiment 11]

The light-emitting device is of the self-emission type, and thus exhibits more excellent recognizability of the displayed image in a light place as compared to the liquid crystal display device. Furthermore, the self-emission device has a wider viewing angle. Accordingly, the light-emitting device can be applied to a display portion in various electronic devices.

Such electronic devices include a video camera, a digital camera, a goggles-type display (head mount display), a navigation system, a sound reproduction device (a car audio equipment and an audio set and so forth), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIGS. 17A to 17H respectively show various specific examples of such electronic devices.

Figure 17A:
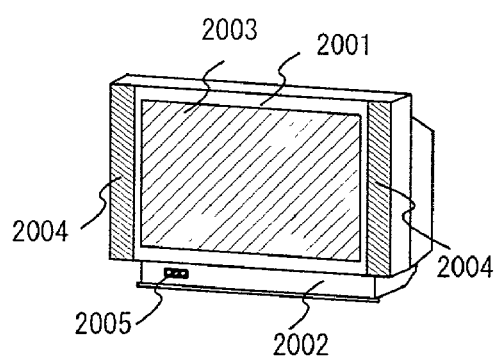
FIGS. 17A to 17H show electronic equipment using the light emitting device of the present invention.

FIG. 17A illustrates an electro-luminescence display device which includes a frame 2001, a support table 2002, a display portion 2003, a speaker portion 2004, a video input terminal 2005 or the like. The present invention is applicable to the display portion 2003. The light-emitting device is of the self-emission type and therefore requires no back light. Thus, the display portion thereof can have a thickness thinner than that of the liquid crystal display device. The electro-luminescence display device is including all of the display device for displaying information, such as a personal computer, a receiver of TV broadcasting and an advertising display.

Figure 17B:
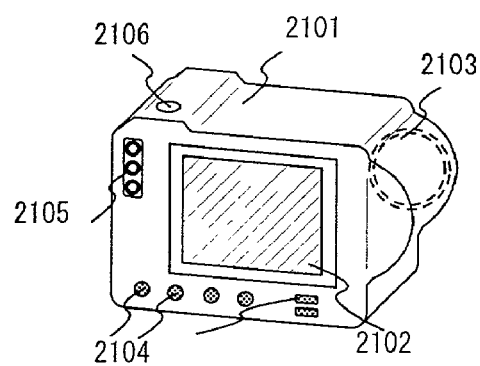

FIG. 17B illustrated a digital still camera which includes a main body 2101, a display portion 2102, an image receiving portion 2103, an operation key 2104, an external connection port 2105, a shutter 2106, or the like. The light-emitting device in accordance with the present invention can be used as the display portion 2102.

Figure 17C:
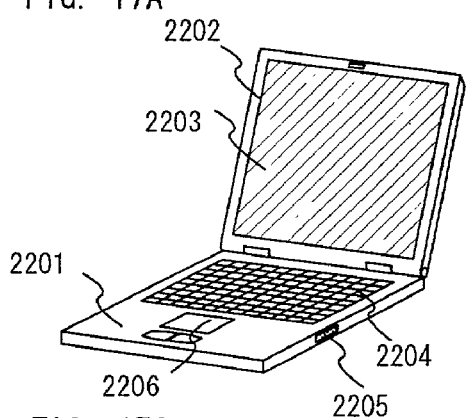

FIG. 17C illustrates a laptop (note-size) computer which includes a main body 2201, a casing 2202, a display portion 2203, a keyboard 2204, an external connection port 2205, a pointing mouse 2206, or the like. The light-emitting device in accordance with the present invention can be used as the display portion 2203.

Figure 17D:
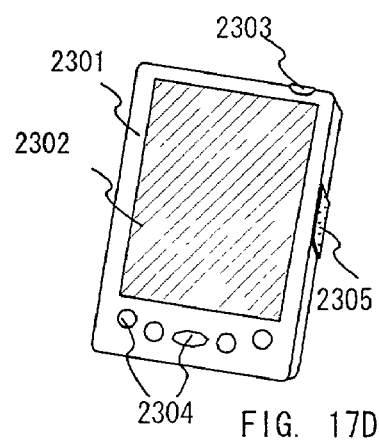

FIG. 17D illustrated a mobile computer which includes a main body 2301, a display portion 2302, a switch 2303, an operation key 2304, an infrared port 2305, or the like. The light-emitting device in accordance with the present invention can be used as the display portion 2302.

Figure 17E:
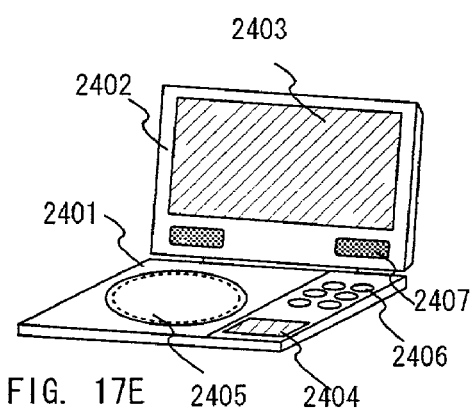

FIG. 17E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device in accordance with the present invention can be used as these display portions A and B, 2403 and 2404. The image reproduction apparatus including a recording medium further includes a game machine or the like.

Figure 17F:
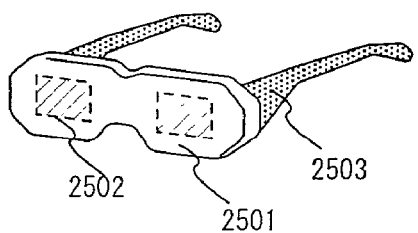

FIG. 17F illustrates a goggle type display (head mounted display) which includes a main body 2501, a display portion 2502, an arm portion 2503. The light-emitting device in accordance with the present invention can be used as the display portion 2502.

Figure 17G:
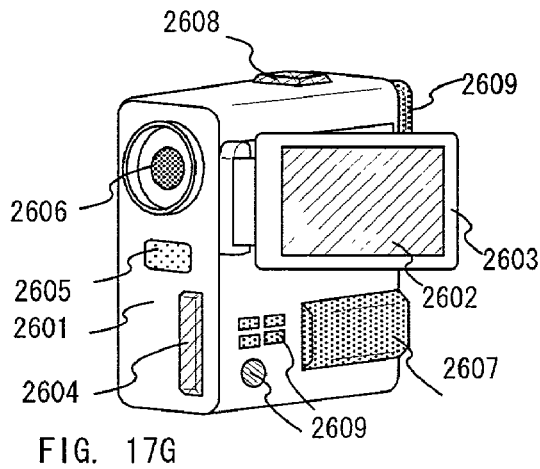

FIG. 17G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light-emitting device in accordance with the present invention can be used as the display portion 2602.

Figure 17H:
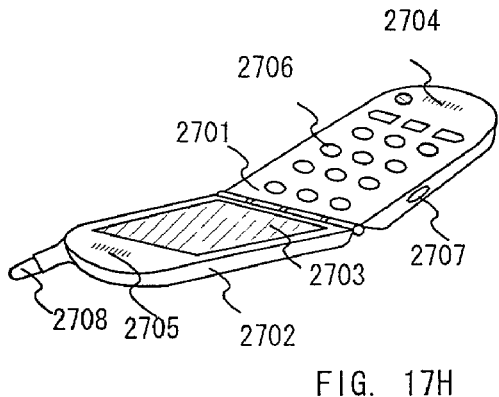
Figure 18A:
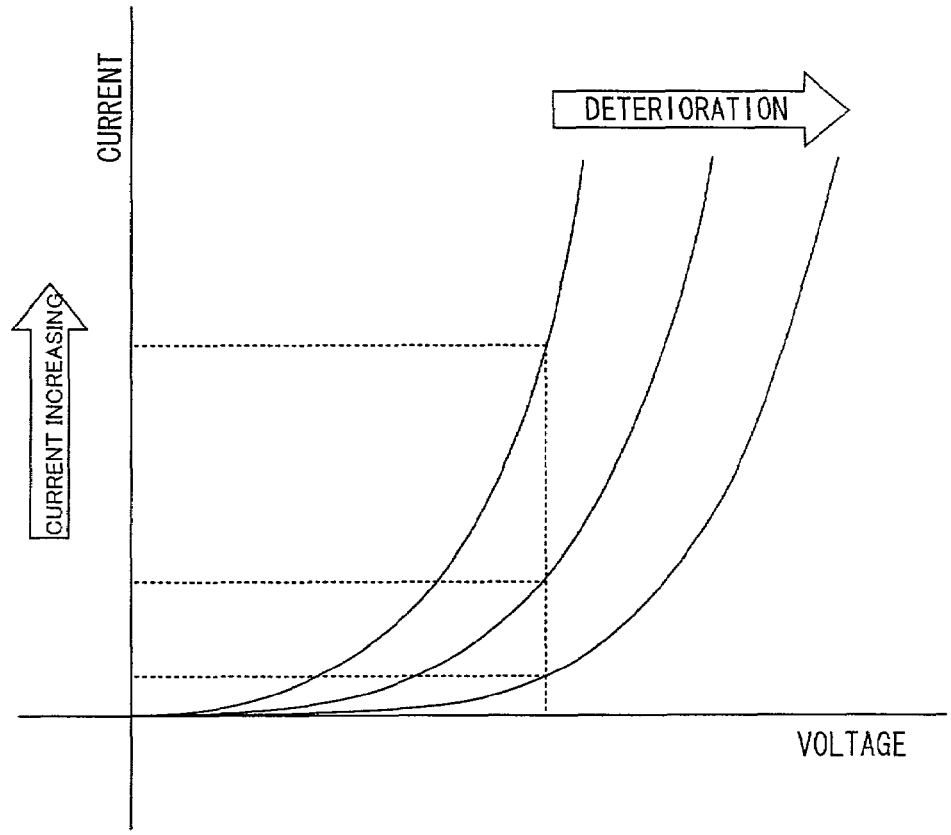
FIGS. 18A and 18B show changes of a voltage-current characteristic and a current-luminance characteristic of an OLED due to deterioration.
Figure 18B:
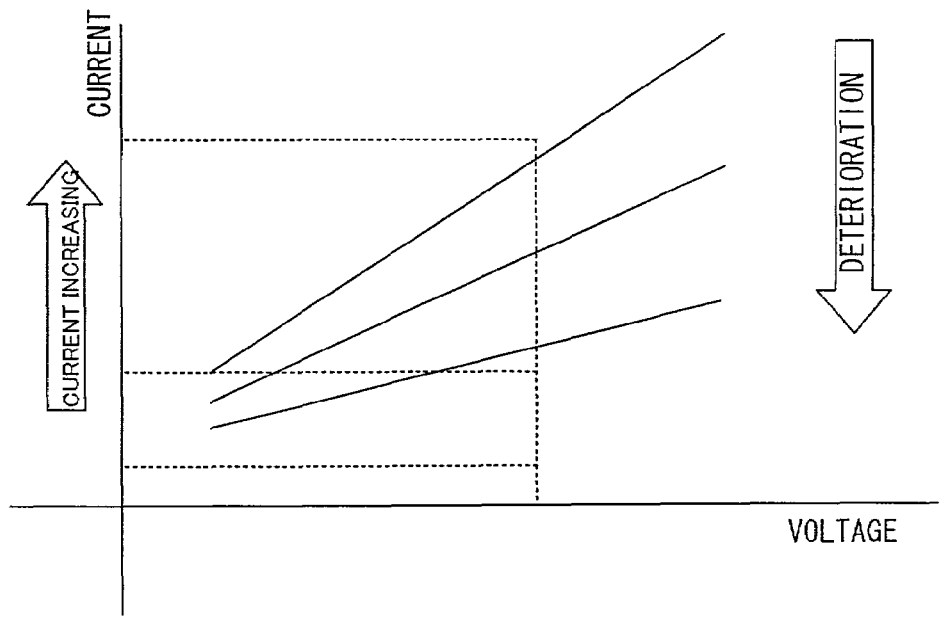

FIG. 17H illustrates a mobile phone (cellular phone) which includes a main body 2701, a casing 2702, a display portion 2703, a sound input portion 2704, a sound output portion 2705, an operation key 2706, an external connecting port 2707, an antenna 2708, or the like. The light-emitting device in accordance with the present invention can be used as the display portion 2703. Note that the display portion 2703 can reduce power consumption of the portable telephone by displaying white-colored characters on a black-colored background.

When the brighter luminance of light emitted from the organic compound layer becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic compound material can exhibit high response speed.

A portion of the light-emitting device that is emitting light consumes power, so it is desirable to display information in such a manner that the light-emitting portion therein becomes as small as possible. Accordingly, when the self-emission device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. The electronic device in the present embodiment can be obtained by utilizing a light-emitting device having the configuration in which the structures in Embodiments 1 through 10 are freely combined.

According to the present invention, the reduction of the luminance of the OLED is suppressed even if the organic light emitting layer is deteriorated with the structure easily used in practical use, as a result of which a clear image can be displayed. Further, in case of the light emitting device with the color display in which the OLEDs corresponding to respective colors are used, the balance of the luminance among the respective colors is prevented from being lost, and a desired color can be kept being displayed even if the organic light emitting layers of the OLEDs deteriorate at different speeds in accordance with the corresponding colors.

Further, the change of the luminance of the OLED can be suppressed even if the temperature of the organic light emitting layer is influenced by the outer temperature, the heat generated by the OLED panel itself, or the like. Also, the increase in power consumption with the temperature rise can be prevented. Further, in case of the light emitting device with the color display, the change of the luminance of the OLED of each color can be suppressed without being influenced by the temperature change. Thus, the balance of the luminance among the respective colors is prevented from being lost, and a desired color can be displayed.

What is claimed is:

1. A light emitting device comprising:
a light emitting device comprising organic material;
means for measuring a current flowing between a first electrode and a second electrode of the light emitting device;
means for comparing the measured current value and a reference current value; and
means for correcting a voltage between the first electrode and the second electrode of the light emitting device for making the value of the current flowing between the first electrode and the second electrode of the light emitting device close to the reference current value based on a difference between the measured current value and the reference current value,
wherein the voltage to be corrected is changed with a constant size every time when the difference between the measured current value and the reference current value is changed with a constant width, and
wherein a specific image is displayed when the current flowing between the first electrode and the second electrode of the light emitting device is measured.

2. A device according to claim 1, wherein the measuring means, the comparing means, and the correcting means are provided for each of corresponding colors of the light emitting device.

3. A device according to claim 1, wherein a period during which the light emitting device emits light is controlled with a digital video signal to display gradations.

4. A device according to claim 1, wherein the comparing means comprises a calculation circuit.

5. A light emitting device comprising:
a plurality of pixels each having a light emitting device comprising organic material;
means for measuring the total of a current flowing between a first electrode and a second electrode of the light emitting devices provided in at least two of the plurality of pixels;
means for comparing the measured current value and a reference current value; and
means for correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value based on a difference between the measured current value and the reference current value,
wherein a specific image is displayed when the total of the current flowing between the first electrode and the second electrode of the light emitting devices provided in the at least two of the plurality of pixels is measured, and
wherein the reference current value differs depending on an image displayed when the total of the current flowing between the first electrode and the second electrode of the light emitting devices provided in the at least two of the plurality of pixels is measured.

6. A device according to claim 5, wherein the measuring means, the comparing means, and the correcting means are provided for each of corresponding colors of the light emitting devices.

7. A device according to claim 5, wherein a period during which the light emitting devices emits light is controlled with a digital video signal to display gradations.

8. A device according to claim 5, wherein the comparing means comprises a calculation circuit.

9. A light emitting device comprising:
a plurality of pixels each having a light emitting device comprising organic material;
means for measuring the total of a current flowing between a first electrode and a second electrode of the light emitting devices provided in at least two of the plurality of pixels;
means for comparing the measured current value and a reference current value; and
means for correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value based on a difference between the measured current value and the reference current value,
wherein the voltage to be corrected is changed with a constant size every time when the difference between the measured current value and the reference current value is changed with a constant width.

10. A device according to claim 9, wherein the measuring means, the comparing means, and the correcting means are provided for each of corresponding colors of the light emitting devices.

11. A device according to claim 9, wherein a period during which the light emitting device emits light is controlled with a digital video signal to display gradations.

12. A device according to claim 9, wherein the comparing means comprises a calculation circuit.

13. A light emitting device comprising:
a plurality of pixels each having a light emitting device comprising organic material in a pixel portion;
means for measuring the total of a current flowing between a first electrode and a second electrode of the light emitting devices provided in at least two of the plurality of pixels;
means for comparing the measured current value and a reference current value;
means for correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value based on a difference between the measured current value and the reference current value,
wherein the reference current value differs depending on an image displayed on the pixel portion when the total of the current flowing between the first electrode and the second electrode of the light emitting devices provided in the at least two of the plurality of pixels is measured.

14. A device according to claim 13, wherein the measuring means, the comparing means, and the correcting means are provided for each of corresponding colors of the light emitting devices.

15. A device according to claim 13, wherein a period during which the light emitting device emits light is controlled with a digital video signal to display gradations.

16. A device according to claim 13, wherein the comparing means comprises a calculation circuit.

17. A light emitting device comprising:
a plurality of pixels each having a light emitting device comprising organic material in a pixel portion, the pixel portion being provided with at least two of the plurality of pixels each having a light emitting device and at least one TFT, and the TFT controlling light emission of the light emitting device;
means for measuring the total of a current flowing between a first electrode and a second electrode of the light emitting devices;
means for comparing the measured current value and a reference current value; and
means for correcting a voltage between the first electrode and the second electrode of the light emitting devices for making the value of the total of the current flowing between the first electrode and the second electrode of the light emitting devices close to the reference current value based on a difference between the measured current value and the reference current value,
wherein a specific image is displayed on the pixel portion when the total of the current flowing between the first electrode and the second electrode of the light emitting devices is measured, and
wherein the reference current value differs depending on an image displayed on the pixel portion when the total of the current flowing between the first electrode and the second electrode of the light emitting devices is measured.

18. A device according to claim 17, wherein the measuring means, the comparing means, and the correcting means are provided for each of corresponding colors of the light emitting devices.

19. A device according to claim 17, wherein a period during which the light emitting device emits light is controlled with a digital video signal to display gradations.

20. A device according to claim 17, wherein the comparing means comprises a calculation circuit.

21. A light emitting device comprising:
a light emitting device comprising organic material;
a variable power supply;
an ammeter for measuring a current flowing between a first electrode and a second electrode of the light emitting device; and
a correction circuit for comparing the measured current value and a reference current value and correcting a voltage between the first electrode and the second electrode of the light emitting device for making the value of the current flowing between the first electrode and the second electrode of the light emitting device close to the reference current value by controlling the variable power supply,
wherein the voltage to be corrected is changed with a constant size every time when the difference between the measured current value and the reference current value is changed with a constant width, and
wherein a specific image is displayed when the current flowing between the first electrode and the second electrode of the light emitting device is measured.

22. A device according to claim 21, wherein the variable power supply, the ammeter and the correction circuit are provided for each of corresponding colors of the light emitting device.

23. A device according to claim 21, wherein a second substrate on which the correction circuit or the ammeter is formed is attached onto a first substrate on which the light emitting device is formed.

24. A device according to claim 21, wherein a second substrate on which the correction circuit or the ammeter is formed is attached onto a first substrate on which the light emitting device is formed by a COG method.

25. A device according to claim 21, wherein a second substrate on which the correction circuit or the ammeter is formed is attached onto a first substrate on which the light emitting device is formed by a wire bonding method.

26. A device according to claim 21, wherein a period during which the light emitting device emits light is controlled with a digital video signal to display gradations.

27. A light emitting device comprising:
a plurality of pixels each having a light emitting device comprising organic material;
an ammeter for measuring the total of a current flowing between a first electrode and a second electrode of the light emitting devices provided in at least two of the plurality of pixels; and
a correction circuit for comparing the measured current value and a reference current value and correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value by controlling a variable power supply,
wherein a specific image is displayed when the total of the current flowing between the first electrode and the second electrode of the light emitting devices provided in the at least two of the plurality of pixels is measured, and
wherein the reference current value differs depending on an image displayed when the total of the current flowing between the first electrode and the second electrode of the light emitting devices provided in the at least two of the plurality of pixels is measured.

28. A device according to claim 27, wherein the variable power supply, the ammeter and the correction circuit are provided for each of corresponding colors of the light emitting device.

29. A device according to claim 27, wherein a second substrate on which the correction circuit or the ammeter is formed is attached onto a first substrate on which the light emitting device is formed.

30. A device according to claim 27, wherein a second substrate on which the correction circuit or the ammeter is formed is attached onto a first substrate on which the light emitting device is formed by a COG method.

31. A device according to claim 27, wherein a second substrate on which the correction circuit or the ammeter is formed is attached onto a first substrate on which the light emitting device is formed by a wire bonding method.

32. A device according to claim 27, wherein a period during which the light emitting device emits light is controlled with a digital video signal to display gradations.

33. A light emitting device comprising:
a plurality of pixels each having a light emitting device comprising organic material;
an ammeter for measuring the total of a current flowing between a first electrode and a second electrode of the light emitting devices provided in at least two of the plurality of pixels; and
a correction circuit for comparing the measured current value and a reference current value and correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value by controlling a variable power supply,
wherein the voltage to be corrected is changed with a constant size every time when the difference between the measured current value and the reference current value is changed with a constant width.

34. A device according to claim 33, wherein the variable power supply, the ammeter and the correction circuit are provided for each of corresponding colors of the light emitting device.

35. A device according to claim 33, wherein a second substrate on which the correction circuit or the ammeter is formed is attached onto a first substrate on which the light emitting device is formed.

36. A device according to claim 33, wherein a second substrate on which the correction circuit or the ammeter is formed is attached onto a first substrate on which the light emitting device is formed by a COG method.

37. A device according to claim 33, wherein a second substrate on which the correction circuit or the ammeter is formed is attached onto a first substrate on which the light emitting device is formed by a wire bonding method.

38. A device according to claim 33, wherein a period during which the light emitting device emits light is controlled with a digital video signal to display gradations.

39. A light emitting device comprising:
a plurality of pixels each having a light emitting device comprising organic material in a pixel portion;
an ammeter for measuring the total of a current flowing between a first electrode and a second electrode of the light emitting devices provided in at least two of the plurality of pixels; and
a correction circuit for comparing the measured current value and a reference current value and correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value by controlling a variable power supply,
wherein the reference current value differs depending on an image displayed on the pixel portion when the total of the current flowing between the first electrode and the second electrode of the light emitting devices provided in the at least two of the plurality of pixels is measured.

40. A device according to claim 39, wherein the variable power supply, the ammeter and the correction circuit are provided for each of corresponding colors of the light emitting device.

41. A device according to claim 39, wherein a second substrate on which the correction circuit or the ammeter is formed is attached onto a first substrate on which the light emitting device is formed.

42. A device according to claim 39, wherein a second substrate on which the correction circuit or the ammeter is formed is attached onto a first substrate on which the light emitting device is formed by a COG method.

43. A device according to claim 39, wherein a second substrate on which the correction circuit or the ammeter is formed is attached onto a first substrate on which the light emitting device is formed by a wire bonding method.

44. A device according to claim 39, wherein a period during which the light emitting device emits light is controlled with a digital video signal to display gradations.

45. A method for operating a light emitting device a plurality of pixels each having a light emitting device comprising organic material, comprising steps of:
measuring the total of a current flowing between a first electrode and a second electrode of the light emitting devices provided in at least two of the plurality of pixels;
comparing the measured current value and a reference current value; and
correcting a voltage between the first electrode and the second electrode of the light emitting devices provided in the at least two of the plurality of pixels for making the value of the total of the current flowing between the first electrode and the second electrode of the light emitting devices provided in the at least two of the plurality of pixels close to the reference current value based on a difference between the measured current value and the reference current value,
wherein a specific image is displayed when the total of the current flowing between the first electrode and the second electrode of the light emitting devices provided in the at least two of the plurality of pixels is measured, and
wherein the reference current value differs depending on an image displayed when the total of the current flowing between the first electrode and the second electrode of the light emitting devices provided in the at least two of the plurality of pixels is measured.

* * * * *